United States Patent [19]

Homma et al.

[11] Patent Number: 4,907,287
[45] Date of Patent: Mar. 6, 1990

[54] IMAGE CORRECTION SYSTEM FOR SCANNING ELECTRON MICROSCOPE

[75] Inventors: Koichi Homma; Fuminobu Komura, both of Yokohama; Tetsuo Yokoyama, Tokyo; Koichi Haruna, Yokohama; Toshihiro Furuya, Katsuta; Hiromi Kashiwabara, Kashiwa; Akira Maeda, Machida; Yutaka Takuma, Tokyo; Takashi Iizumi, Kawasaki, all of Japan

[73] Assignee: Hitachi, Ltd., Tokyo, Japan

[21] Appl. No.: 332,376

[22] Filed: Mar. 31, 1989

Related U.S. Application Data

[63] Continuation of Ser. No. 919,426, Oct. 16, 1986, abandoned.

[30] Foreign Application Priority Data

| Oct. 16, 1985 | [JP] | Japan | 60-228683 |
| Nov. 15, 1985 | [JP] | Japan | 60-254754 |
| Jun. 2, 1986 | [JP] | Japan | 61-125731 |
| Jun. 11, 1986 | [JP] | Japan | 61-133650 |

[51] Int. Cl.$^4$ .............................................. G06K 9/40
[52] U.S. Cl. ...................................... 382/54; 250/311; 250/396 R; 250/397

[58] Field of Search ................... 250/310, 311, 396 R, 250/397; 364/167, 515, 490, 491; 382/6, 41–43, 45, 49, 52, 8, 54, 34; 358/100, 101, 106, 107

[56] References Cited

U.S. PATENT DOCUMENTS

| 3,908,124 | 9/1975 | Rose | 250/311 |
| 3,971,936 | 7/1976 | Hoppe | 250/311 |
| 4,031,391 | 6/1977 | Hoppe | 250/311 |
| 4,441,205 | 4/1984 | Berkin et al. | 382/8 |
| 4,449,193 | 5/1984 | Tournois | 382/42 |
| 4,494,000 | 1/1985 | Shii et al. | 250/311 |
| 4,585,943 | 4/1986 | Yasuda et al. | 250/396 R |
| 4,618,766 | 10/1986 | von der Mast et al. | 250/396 R |
| 4,651,341 | 3/1987 | Nakashima et al. | 382/34 |
| 4,680,469 | 7/1987 | Nomura et al. | 250/311 |
| 4,695,725 | 9/1987 | Mori et al. | 250/397 |

*Primary Examiner*—Leo H. Boudreau
*Assistant Examiner*—Jose L. Couso
*Attorney, Agent, or Firm*—Antonelli, Terry & Wands

[57] ABSTRACT

An image correcting apparatus for correcting distortion appearing in an image produced by electron beam scanning in a SEM under the influence of electric, magnetic and mechanical vibrations through arithmetic operations for eliminating the distortion. Installation of electric shield, magnetic shield and vibration-damping structure is thus rendered unnecessary.

7 Claims, 16 Drawing Sheets

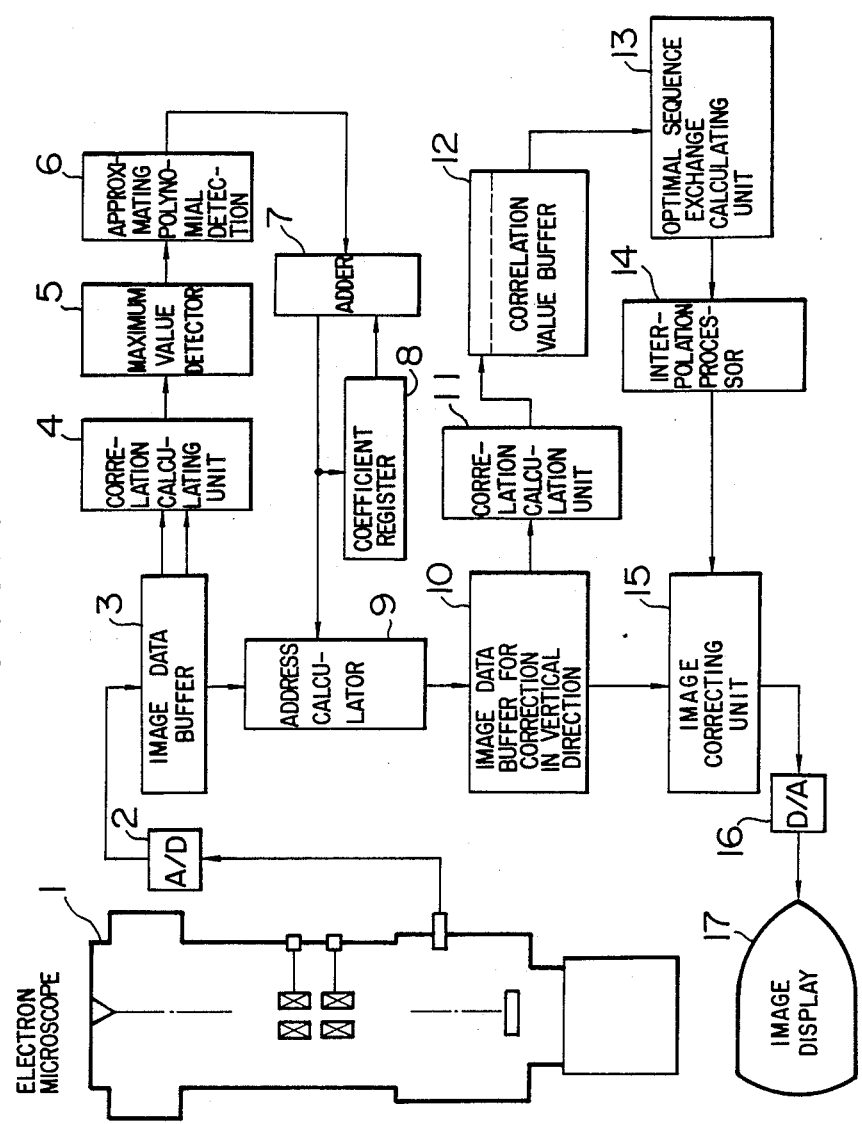

FIG. 4A
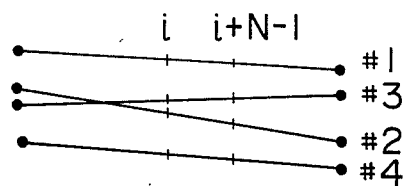
FIG. 4B
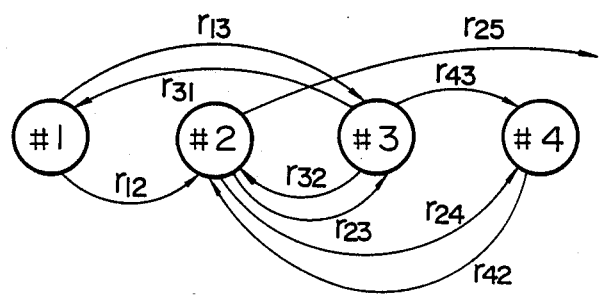
FIG. 4C
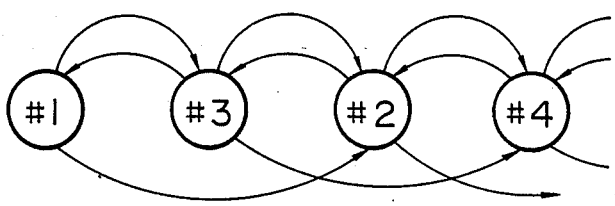
FIG. 4D
|   | #1 | 2 | 3 | 4 |
|---|---|---|---|---|
| #1 |   | $r_{12}$ | $r_{13}$ |   |
| 2 |   |   | $r_{23}$ | $r_{24}$ |
| 3 | $r_{31}$ | $r_{32}$ |   |   |
| 4 |   | $r_{42}$ | $r_{43}$ |   |

FIG. 6
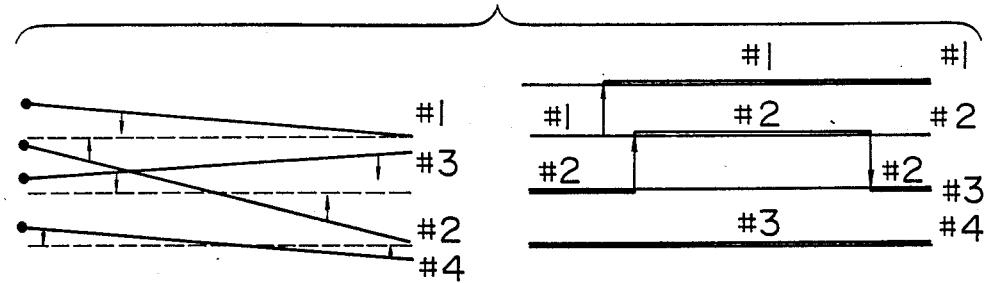
FIG. 7
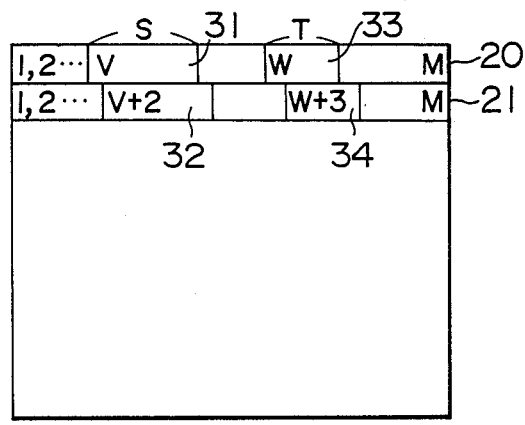
FIG. 8
| LINE NO. / LINE NO. | 1 | | 2 | |
|---|---|---|---|---|
| | PIXEL CENTER | DISTORTION VALUE | PIXEL CENTER | DISTORTION VALUE |
| 1 | $V + \frac{2}{S}$ | -2 | $W + \frac{2}{T}$ | -3 |
| 2 | $V + \frac{2}{S}$ | -4 | $W + \frac{2}{T}$ | -3 |
| 3 | $V + \frac{2}{S}$ | 1 | | |

CORRELATION VALUE MAP IN ABSENCE OF SCAN VIBRATION

VIBRATION CAUSING SCAN LINE EXCHANGE

CORRELATION VALUE MAP FOR VIBRATION OF FIG. 12B

CORRELATION VALUE MAP FOR SMALL SCAN VIBRATION

VERTICAL IMAGE INTERPOLATION PROCESSING

PIXEL CORRESPONDENCE IN VERTICAL DIRECTION
IN CASE SCANNING LINE EXCHANGE OCCURS

OBJECT COORDINATE SYSTEM

OUTPUT IMAGE COORDINATE SYSTEM

IMAGE CORRECTION SYSTEM FOR SCANNING ELECTRON MICROSCOPE

This application is a continuation application of application Ser. No. 06/919,426, filed Oct. 16, 1986 now abandoned.

BACKGROUND OF THE INVENTION

The present invention relates to an image correction system for a scanning electron microscope (hereinafter referred to as SEM in abbreviation). More particularly, the present invention concerns an image correction system which can be advantageously used for correcting disturbances appearing in a SEM image under the influence of vibration superposed on the scanning operation, reducing the blur of images by averaging image data over a plurality of image frames, and further correcting image distortion produced under action of the magnetic fields generated by power sources employed in peripheral equipment.

FIGS. 2A and 2B of the accompanying drawings are views for illustrating schematically how a SEM image undergoes disturbance when vibration is superposed on the scanning by an electron beam. More specifically, FIG. 2A shows a pattern of an object under examination and scanning lines. As will be seen, the individual scanning lines are not only dislocated irregularly in the horizontal direction but also vertically deviated at random. In an extreme case, there may occur such situation in which the scanning direction is changed over to the vertical direction. However, since the maximum frequency of the scan vibration is low when compared with the scanning frequency, the scanning in the linear pattern can be assured although displacement, expansion/contraction and tilting of the scanning lines may occur, as will be seen in FIG. 2A. An image of the object shown in FIG. 2A picked up through the electron beam scanning is illustrated in FIG. 2B. It will be seen that the peripheral edge of the image pattern is disturbed with fluctuation in the horizontal direction, while interruption of the image pattern appears in the vertical direction.

Such image disturbance caused by the vibratory scanning in a scanning image pick-up system is also experienced during topographical observations of the earth using an artificial satellite. An approach for solving this problem, is proposed in the image distortion correcting system, as disclosed, for example, in Japanese Patent Application Laid-Open No. 58574/1984 (JP-A-59-58574). According to this known proposal, vibration in the attitude of the satellite which provides a main factor for the scan vibration is measured by means of a high-precision attitude angle detector, wherein the deviation in the scanning position (scan dislocation) is determined on the basis of a geometrical model. Data of the scan dislocation thus obtained is utilized for rearranging the image data for performing the correction of the image distortion. In contrast, in the case of the SEM, the scan vibrations are attributable to many vibration sources such as fluctuation in the magnetic field and power supply sources, not to say of mechanical vibration. Such being the circumstances, a great difficulty has been encountered in determining the magnitude of positional deviation or dislocation in a SEM image with an acceptable accuracy on the basis of a scan deviation model which must be prepared by measuring all the causes for the scan vibration with adequate accuracy.

Next, problems in an image processing system for a SEM in which an averaging procedure of a plurality of image frames is adopted will be described by referring to FIG. 15 of the accompanying drawings which shows an arrangement of the image processing system. Referring to the figure, an image signal obtained from the scanning with an electron beam in the SEM 1 is supplied to an analogue-to-digital or A/D converter 2 to be converted to digital image data, which data is then combined with average image data read out from an image data memory 3 through simple addition or addition/averaging operation in an image averaging unit 4, the resultant data being then written in the memory 3. The scanning and averaging processing for a single image mentioned above is repeated a multiple number times ten during a period of one second. Through the procedure of repeating the image averaging processing, as mentioned above, the image read out from the image data memory 3 by an image data reader 5 can enjoy high definition or clearness on an image display 10, even when the image obtained through a single scan operation is degraded in S/N ratio. In the case of the SEM which adopts the so-called multiframe averaging system incorporating the image memory, various positional alignment can be started at an earlier point in the average repetition process, which thus allows measurements of semiconductor specimen or the like with a small quantity of electron irradiation.

However, should mechanical vibration be transmitted to the SEM equipment, the scanning electron beam is deviated from a predetermined position at random. Consequently, in the addition and averaging processing, the image data at relatively deviated or dislocated positions will be added and averaged, resulting in an output image which can not be freed from blur. The magnitude of the blur is of course in proportion to the vibration applied. It should be mentioned that the correction of blur attributable to the mechanical vibration has not be taken into consideration in the hitherto known system.

SUMMARY OF THE INVENTION

It is therefore an object of the present invention to eliminate the drawbacks of the prior art system described above and provide an image correction system for a scanning electron microscope (SEM) which can produce an output image of high clearness or definition without requiring a measuring the mechanical vibration, fluctuation in the magnetic field and other type of adverse influences which are the causes for distortion, blur and the like unwanted phenomena.

In view of the above object, it is proposed according to the present invention that distortion appearing on the image resulting from the electron beam scanning is eliminated without requiring vibration-proof mechanism or magnetic shield or the like. More specifically, according to a first aspect of the invention, the results of calculation of mutual correlation functions concerning line fragments of an image obtained through scanning is utilized for determining an inter-line relative positional deviation quantity in the scanning direction. Subsequently, inter-line positional exchange in the vertical direction is detected by calculating the mutual (reciprocal) correlation values of the line fragments of the scanned image over a plurality of lines and by extracting components of the correlation value which vary with respect to the line number.

A second aspect of the present invention is directed to the processing of reducing the blur of the output image due to the mechanical vibration transmitted to the SEM. Ordinarily, the SEM is equipped with a vibration-proof mechanism so as to prevent high frequency components of the on-site mechanical vibration from being transmitted to the SEM. Consequently, the period of the vibration component transmitted to the SEM is long as compared with the image scanning period, as a result of which the scan image of one frame has geometrical distortions which change slowly within the image. It is extremely difficult to estimate the geometrical distortion or discrepancy between the scanned image and the stored image in the image memory by measuring the mechanical vibration at the time of scanning operation. This is because the vibration is of low frequencies and because a model prepared on the basis of the measured values in consideration of the scan vibration is indefinite. To deal with this problem, the concept underlying the second feature of the present invention resides in that when the magnitude of distortion varying slowly in the image can be estimated, the output image of high clearness comparable to what can be realized in the absence of the mechanical vibration will be able to be produced by correcting the inter-image relative geometrical distortion before performing the image addition/averaging processing. Starting from this concept, the magnitude of positional deviation at a typical point of the image is determined at a location where the inter-image mutual correlation function assumes a peak value. On the basis of the magnitude of positional deviation thus determined, the distortion of the whole image which varies slowly is estimated.

According to a third aspect of the present invention which is directed to suppression of the image distortion varying slowly on the image under the influence of the magnetic fields generated by power supply sources, data resulting from the scanning is obtained in a certain synchronous phase and stored in an image memory. Subsequently, the synchronous phase is changed only a minute amount, wherein the image data of the same field of view is inputted again as an image having the distortion displaced. Difference between both images mentioned above is determined by a subtractor, while differential values or derivatives of the image data in the scanning direction as well as in the direction perpendicular to the scanning direction are determined by a differential operation unit. On the basis of these difference and derivatives, the intensity of distortion of the image due to the magnetic field is estimated through a method of least squares based on difference equations expressing image changes due to the minute displacement of distortion. The estimated distortion is then utilized for correcting the image data on the image memory.

BRIEF DESCRIPTION OF THE DRAWINGS

FIG. 1 is a view showing a general arrangement of an image correction system for a scanning electron microscope or SEM according to a first embodiment of the present invention;

FIGS. 4A, 4B, 4C and 4D are views for illustrating the principle for detecting the exchange of sequential order in the vertical direction through a relaxation method based on the correlation values between the line fragments;

FIG. 6 is a view showing an example of the image correction in the vertical direction perpendicular to the scanning direction;

FIG. 7 is a view for illustrating the processing for determining the relative distortion by making use of line fragments in a image correction system according to a second embodiment of the invention;

FIG. 8 is a view showing contents of a memory storing the values of distortion as determined;

DESCRIPTION OF THE PREFERRED EMBODIMENTS

Figure 2A:
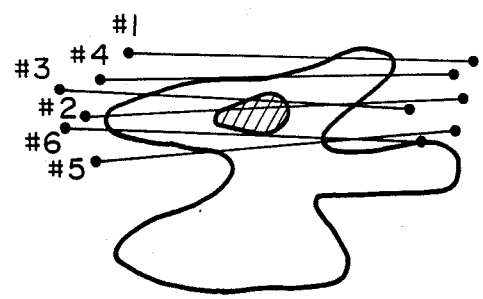
FIGS. 2A and 2B are views for illustrating disturbance or distortion appearing in an image produced by the SEM when vibration is superposed on the scanning operation.
Figure 2B:
Figure 3A:
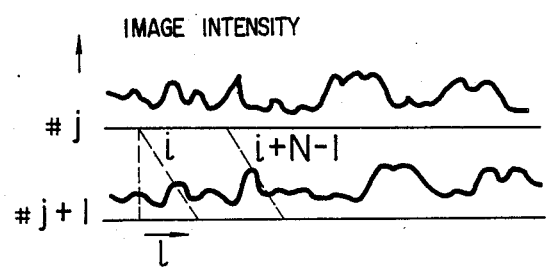
FIGS. 3A and 3B are views for illustrating the principle for detecting relative deviation in the scanning direction between data of adjacent scan images by using a function expressing a mutual correlation of line fragments in both images and the data of a position at which the function assumes a peak value.
Figure 3B:
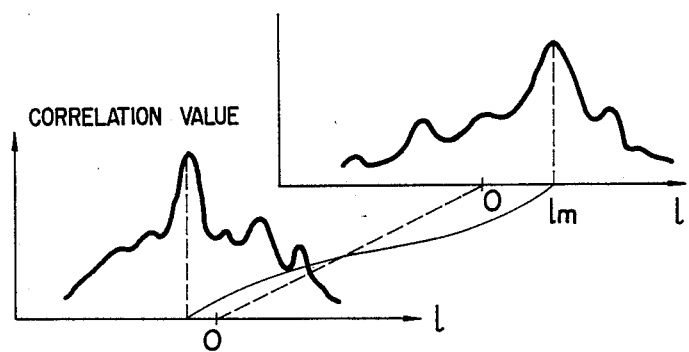

In the first place, description will be made on the principle underlying the present invention. Referring to FIG. 3A which shows intensity distributions of images produced successively through scanning, it will be seen that although the scanning speed and the scanning position undergo fluctuations, the intensity distributions of the j-th scanned image and the (j−1)-th scanned image are similar to each other except for shifts in the position, because both of the images are obtained through scanning of positions located in the vicinity of a certain horizontal linear line. Magnitude of the shift of the image intensity pattern is determined in dependence on the peak position at which a reciprocal or mutual correlation function defining correlation existing between image line fragments reaches a peak value, as is illustrated in FIG. 3B. As will be seen in this figure, the magnitude of relative deviation of the image at the peak position of the mutual correlation function, i.e. the deviation between two lines varies in accordance with the position on the line.

It is assumed that the digital image data is expressed by $x(i, j)$ wherein i represents the number identifying the pixel (picture element) in the scanning direction, and j represents the line identifying number. When the correlation function between an image line fragment having a length of N extending from the i-th pixel on the j-th line is expressed by $R(i, j, l)$, this correlation function is given by $$R(i, j, l) = \frac{1}{N} \sum_{K=0}^{N-1} x(i+k, j) \cdot x(i+k+l, j+1) \quad (1)$$
$$l = -P, \ldots, P$$

where l represents the relative position of the image line fragment on the j-th line relative to the (j+1)-th line. When the peak position of the mutual correlation function (the relative positional deviation function) is represented by $l_m(i, j)$, the following valid relation applies:

$$R(i, j, l_m(i, j)) \geq R(i, j, l) \quad (2)$$

Since the relative positional deviation function $l_m(i, j)$ defining the positional deviation between each of the scanning lines j and the immediately following scanning line (j+1) usually contains noise, approximation with a polynomial of degree M may be made in accordance with the following expression:

$$l_m(i, j) \simeq \sum_{t=0}^{M} a_t(j) \cdot i^t \quad (3)$$

Magnitude of the overall absolute positional deviation of each scanning line j ($\geq 2$) can be expressed as follows:

$$L(i, j) = L_0(i) + \sum_{k=1}^{j-1} l_m(i, k) \quad (4)$$

where $L_0(i)$ represents the absolute positional deviation of the first line. Coefficient $(A_t(j))$ of the polynomial approximation for the overall positional deviation is given by $$A_t(j) = A_t^0 + \sum_{k=1}^{j-1} a_t + (k) \quad (5)$$

where $L_0(i) \simeq \sum_{t=0}^{M} A_t^0 \cdot i^t$.

Correction of disturbance of the image in the scanning direction can be carried out in such a manner in which the position of the pixel on a succeeding scanned image corresponding to the correct pixel position i for each scan image line is determined in accordance with $$i + \sum_{t=0}^{M} A_t + (j) \cdot i^t \quad (6)$$

and the image data is placed at the pixel position as determined or at a position closest to that pixel position.

Next, description is made on the principle of detecting the sequential exchange of the image in the vertical direction perpendicular to the scanning direction, by referring to FIGS. 4A to 4D. When the image data which has undergone the correction in the scanning direction is represented by $x(i, j)$, values of the mutual correlation function $r_{j, j+m}(i)$ defining the correlation between the image line fragments at the pixel position i over a plurality of lines can be determined in accordance with $$r_{j,j+m}(i) = \frac{1}{N} \sum_{k=0}^{N-1} x'(i+k, j) \cdot x'(i+k, j+m) \quad (7)$$
$$0 \leq m$$

FIG. 4A shows individual scanning lines located at positions on a corresponding actual objective pattern after the correction in the scanning direction. It will be seen that the scanning positions of the third line and the second line are reversed with respect to the line fragment (i+N−1) from the pixel number i. In this connection, it is noted that the mutual correlation of the intensity between two points on the image generally decreases monotonously as a function of the distance between the two points. Similarly, the mutual correlation value between the line fragments decreases monotonously as a function of the distance between the line fragments. Accordingly, by examining the mutual correlation values $r_{j, j+m}(i)$ over a plurality of lines, it is possible to detect the line exchange in sequence in the vertical direction perpendicular to the scanning direction. FIG. 4B shows the mutual correlation values of the line fragment at the pixel position i on a directed graph of the line numbers. Arc representative of the correlation of a small value is omitted from illustration. Although the correlation values should inherently satisfy the condition of symmetry $r_{rq} = r_{qp}$, corrections mentioned below is performed for intensifying the relation in the forward direction.

$$\left. \begin{array}{l} p > q \; r_{pq} = r_{qp} \\ p < q \; r_{pq} = r_{qp} + d \end{array} \right\} \quad (8)$$

What is to be determined is a path or route which starts from the node #1 shown in FIG. 4B and passes once through each of the nodes along the directed graph and which makes the sum of the related correlation values maximum. FIG. 4C shows a directed graph in which the nodes (i.e. the line numbers are rearranged so as to satisfy the conditions for the route mentioned above. The path or route in concern is heretofore found through procedure for solving a combinatory problem, which takes however a lot of time. Under the circumstances, the optimum route is determined by a relaxation method by utilizing a table of correlation values $r_{pg}$ shown in FIG. 4D. Namely, operations mentioned below are repeated.

$$r_{pq} = (1 + \alpha) r_{pq} - \alpha \sum_{\substack{u = p \\ \text{or } v = q}} r_{uv} + \beta \sum_{\substack{u \neq p \\ \text{and } v \neq q}} r_{uv} \quad (9)$$

By performing the above operation, the correlation value $r_{pq}$ of a relatively large magnitude tends to suppress the correlation values on the same row and on the same column. In contrast, the correlation values which are not resident on the same row and on the same column tend to be increased. Accordingly, after the repeated execution of operation in accordance with the above expression (9), each of the row and columns contains only one predominant correlation of a large value. Thus, by detecting the abovementioned correlation value through a threshold processing, the correct line sequence shown in FIG. 4C can be determined on the basis of the numerical values representing the row and columns containing the abovementioned correlation value.

Figure 5:
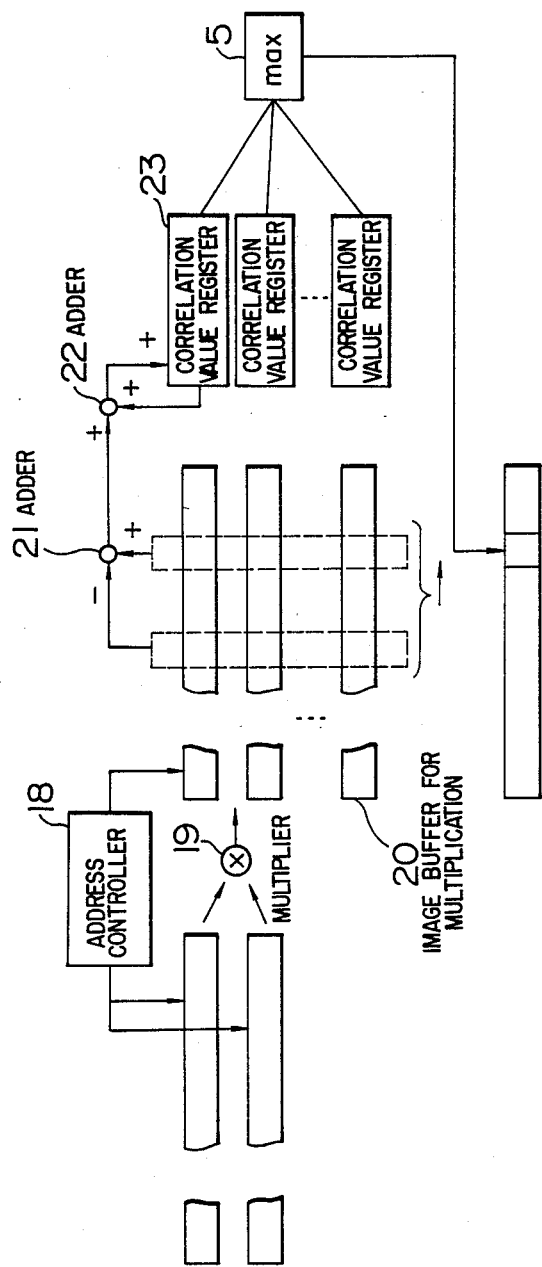
FIG. 5 is a view showing an arrangement of a correlator for the scanning direction.

Now, the image correction system according to a first embodiment of the present invention will be described by referring to FIG. 1. A scanned image signal obtained from a scanning electron microscope or SEM 1 is converted to a digital signal by an A/D converter 2 and is subsequently stored once in an image buffer memory 3. Image data of two successive adjacent lines stored in the image buffer memory 3 is inputted to a correlation calculation unit 4 for determining the mutual correlation function defining the correlation existing between the image line fragments in accordance with the expression (1) mentioned hereinbefore. FIG. 5 illustrates the arithmetic processing executed by the correlation calculation unit 4. The image data $x(i, j)$ and $x(i, j+1)$ (where i=1, ..., the number of pixels) are read out through an address controller 18 with the image data of one line being delayed by l pixels relative to the other, and both image data are multiplied with each other through a multiplier 19, the resultant product being stored in a multiplied image buffer 20 at a l-th address. The reading and multiplication procedure is executed by varying the amount of delay l. Upon completion of the read and multiplication, arithmetic determination of the mutual correlation function R(i, j, l) is given by the expression (1) from the multiplied image data $x(i+1, j) \cdot x(i, j+1)$ stored in the buffer 20 is performed in accordance with the sequential expression (10) mentioned below with the aim to attain significant reduction in the quantity of operation.

$$R(i + 1, j, l) = R(i, j, l) + \frac{1}{N} \{x(i + N, j) \cdot \quad (10)$$

-continued
$$x(i + N + l, j + 1) - x(i, j) \cdot x(i + l, j + 1)\}$$

More specifically, data corresponding to the two pixel positions i and (i+N) are read out from the multiplied image buffer 20 to determine the result R(i+1, j, l) of the expression (10) through adders 21 and 22. The correlation value thus obtained as result of execution of the expression (10) is first stored in a correlation value register 23 to be utilized later on in executing the sequential calculation in accordance with the expression (10) for the data at the position (i+1). From the correlation function concerning the first pixel and held by the register 23, the peak position $l_m(i, j)$ is detected through a maximum value detector 5, and subsequently converted into a coefficient of a polynomial expression representative of the relative line deviation of the i-th line in the scanning direction by means of an approximate polynomial detector 6 operative based on a method of least squares. An adder 7 performs sequentially calculation given by the expression (5). More specifically, the contents of a polynomial coefficient register 8 containing the coefficient of the polynomial representing the absolute deviation in the scanning direction is read out to be added to the coefficient of the relative deviation polynomial, to obtain the coefficient of the absolute deviation polynomial concerning the line j. An address calculator 9 for the image correction in the scanning direction performs calculation in accordance with the expression (6) for outputting the corrected image data at the i-th pixel to determine the number identifying the pixel to be read out from the image data buffer 3.

The image data corrected in the scanning direction is stored in an image data buffer 10 employed for performing correction in the vertical direction perpendicular to the scanning direction. This image data buffer is stored with the number m of lines which are disturbed in the direction perpendicular to the scanning direction. A correlation calculation unit 11 determines the mutual correlation values $r_{j, j+m}(i)$ between the image line fragments in accordance with the expression (7) at several typical pixel positions on the line j in concern. The correlation value buffer 12 stores therein the mutual correlation values for m lines and is adapted to be inputted with the correlation value from the correlation calculator 11 according to a first-in, first-out (FIFO) method. An example of the correlation value table stored in the correlation value buffer is illustrated in FIG. 4D. Through the relaxation operation according to the expression (9) through optimal sequence exchange determining means 13, the optimal sequence exchanges at the typical pixel positions are determined. An interpolation processing unit 14 approximates the optimal sequence exchange with a low-degree expression concerning the pixel position and outputs a coefficient to a vertical image correction unit 15. On the basis of the coefficient, the correction unit 15 calculates the address which allows the image data closest to the output image line (indicated by a broken line) to be selected from the image buffer 10 and outputs the corrected image. The image data corrected also in the vertical direction is converted to a standard video signal through a digital-to-analogue (D/A) converter 16 to be subsequently displayed on an image display unit 17. According to the instant embodiment, display of the corrected image on the display unit is started when the buffer 10 for image correction becomes full after the scanning operation is started in the SEM 1. Accordingly, the image correction according to the instant embodiment may be referred to as the real-time image correction processing.

Next, a second embodiment of the present invention which corresponds to a modification of the first embodiment described above will be described. In the case of the second embodiment, vibration along a scanning direction occurring during a single scanning line is taken into consideration. Variation of distortion within a single line can be determined by determining the distortion of a fragmental line portion on the basis of correlation determined between fragmental portions of the scanning lines and by performing the determination of distortion at several points on the line. By utilizing the information thus obtained as well as information derived from the scanning operation, the vibration for the whole area or region can be estimated to allow the distortion to be corrected with high accuracy In the following, the second embodiment of the present invention will be described by referring to FIGS. 7 to 10.

An example of image data obtained through image processing is shown in FIG. 7. In a line 20 consisting of M pixels, a line fragment 31 consisting of S pixels including as the first or start pixel the V-th pixel on the line 20 as counted from the left-hand side is picked up and correlated to a line fragment consisting of S appropriate pixels of the immediately underlying line 21. By way of example, it is assumed that the first mentioned line fragment 31 exhibits the strongest correlation with a line fragment 32 of the underlying line 21 consisting of S pixels including as the first pixel the (V+2)-th pixel of the line 21 as counted from the left-hand side. On this assumption, a relative distortion value of the (V+S/2)-th pixel on the line 20 relative to the succeeding line is represented by "-2" and stored in a memory. Next, a line fragment 33 consisting of T pixels including as the start pixel thereof the W-th pixel of the line 20 as counted from the left-hand side is picked up and correlated to a line fragment consisting of T appropriate pixels of the underlying line 21. By way of example, it is assumed that the line fragment 33 exhibits the strongest correlation with a line fragment 34 of the line 21 which consists of T pixels including as the start one the (W+3)-th pixel as counted from the left-hand side. At this time, the relative distortion value of the (W+T/2)-th pixel of the line 20 relative to the underlying line 21 is represented by "-3" and stored in the memory.

Through a similar procedure, the distortion values at two positions are determined for each of the lines, whereby distortions in a number of 2(N−1) in total are stored in the memory. It is however apparent that the invention is not restricted to the determination of distortions at two positions but any desired number of distortions can be determined appropriately in consideration of the image under examination. The results obtained through the procedure described above are shown in FIG. 8.

Figure 9A:
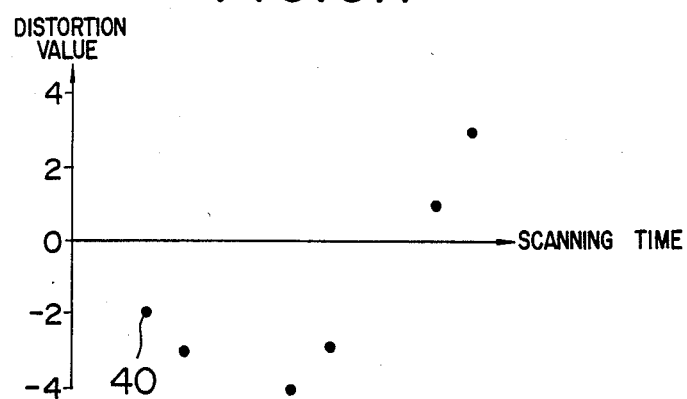
FIGS. 9A and 9B are views for illustrating a relationship existing between the scan time and the value of distortion.
Figure 9B:
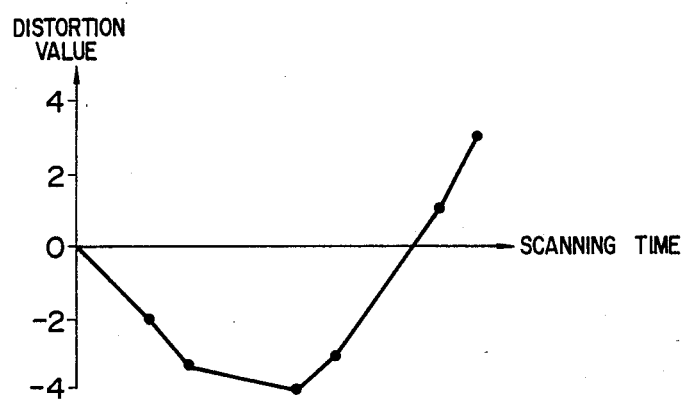
Figure 10:
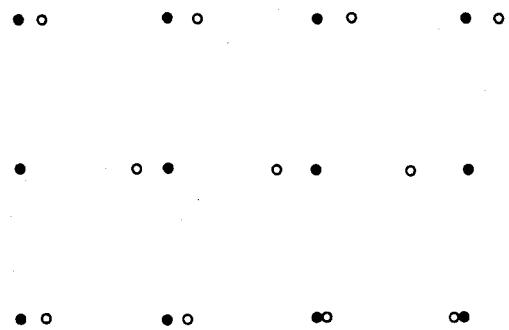
FIG. 10 is a view for illustrating relationships between original pixels (picture elements) and those added by distortion.

Next, the information about the scan time in the SEM is utilized together with the information shown in FIG. 8 to plot a graph illustrated in FIG. 9A in which the scan time is taken along the abscissa with the value of distortion being taken along the ordinate. For example, a point 40 represents the value of distortion at the (V+S/2)-th pixel along the ordinate at the scanning time of said pixel taken along the abscissa FIG. 9B shows a graph obtained through linear interpolation of the individual points shown in FIG. 9A. On the basis of the result shown in FIG. 9B, vibrations occurring at the relevant scan time points can be estimated. FIG. 10 shows a portion of an image in which solid points represent ordinal pixel positions while small circles represents estimated pixel positions resulted from the addition of estimated distortions to the respective original pixel positions. By determining the brightness of the small circles through interpolation of the solid or black points, there can be obtained an image from which distortions due to vibration in the scanning direction are eliminated.

It goes without saying that the interpolation of distortions can be accomplished with the aid of polynomials by parts.

According to the second embodiment of the invention described above, vibration in the scanning direction can be estimated for the whole image, whereby distortions due to vibration of the scanning direction in the SEM image can be eliminated with high accuracy.

Next, a third embodiment of the invention which corresponds to a further modification of the first embodiment will be described. The third embodiment is so designed that in case the vibration of scanning has a frequency component of a longer period than the electron beam scanning period, the vibration itself is estimated on the basis of information concerning the inter-line correlation to thereby eliminate distortion due to the vibration of scanning at a high speed with high accuracy. More specifically, according to the third embodiment of the present invention, vibration in the scanning direction is estimated by applying a filtering processing for eliminating low frequency vibration components on the line based on the positional deviations of the individual image line fragments in the scanning direction as obtained through the procedure for determining correlation between the image line fragments. From the mutual correlations determined over a plurality of lines, i.e. two-dimensional array determined by the line identifying numbers and the interline distances, unidirectional projection data is obtained from which the vibration of the scanning in the vertical direction perpendicular to the scanning direction is estimated.

In the first place, operation of the low-pass filter processing in the scanning direction will be described. The image data to be corrected is represented by x(i, j) where i represents the number identifying the pixel in the scanning direction and j represents the line identifying number. The mutual correlation function $R_f(i, j, k)$ defined between an image line fragment of a length l including the i-th pixel on the j-th line as the center pixel and an image line of the (j+1)-th line can be calculated in accordance with $$R_f(i,j,k) = \frac{1}{l} \sum_{t=-l/2}^{l/2} X(i+t,j) \cdot X(i+k+t,j+1) \quad (11)$$

$$k = -p, \ldots, p$$

The relative positional deviation between the adjacent scan images can be derived from a distance k in the scanning direction for which the mutual correlation function becomes maximum. Assuming that the relative positional deviation of the j-th line is represented by $k_j(i)$, the absolute positional deviation $d_j(i)$ of the j-th line in the scanning direction is given by $$d_j(i) = \sum_{s=1}^{j-1} k_s(i) + k_0(i) \tag{12}$$

The absolute positional deviation $d_j(i)$ in the scanning direction represents not only the deviation due to the vibration of scanning but also the influence of a pattern portion predominant in an oblique direction in the image. In other words, even in the case where no vibration of scanning is present, the peak position $k_j(i)$ of the interline correlation defined between the adjacent lines may assume a value not equal to zero due to the presence of a pattern in an image in an oblique direction thereof. For this reason, the true vibration of scanning is extracted separately from the deviation $d_j(i)$ through the frequency processing expressed by $$\hat{d}_j(i) = F^{-1}[H(\omega) \cdot F\{d_j(i)\}] \tag{13}$$

where $\hat{d}_j(i)$ represents an estimated value of the true vibration of scanning, $F^{-1}$ represents Fourier (inverse) transformation, $\omega$ represents the frequency for the line numbered j, and $H(\omega)$ represents a filter coefficient. Change in the correlation peak position error due to the presence of a pattern in the image in an oblique direction as a function of the line number contains many low-frequency components which are not concentrated toward a predetermined frequency component so far as the image is not a regular pattern. Accordingly, a low-frequency eliminating filter may be employed whose filter coefficient $H(\omega)$ assumes a value of "1" in the frequency band of the true vibration of scanning while taking a value of "0" at other frequency 107.

Figure 12A:
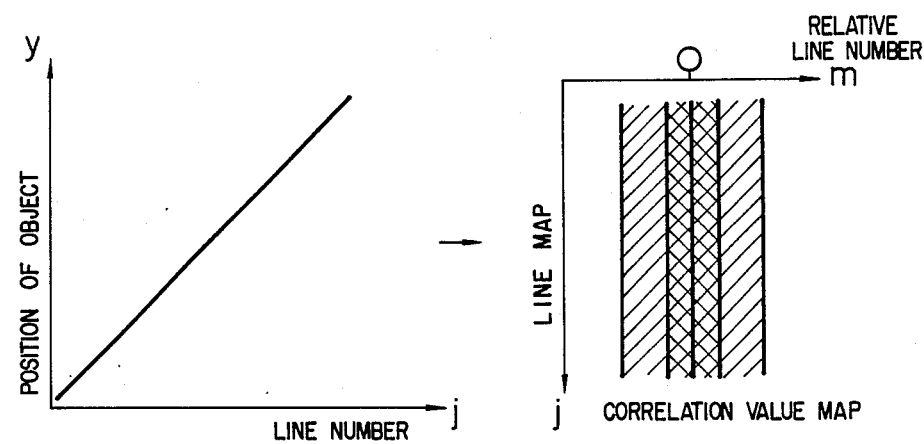
FIGS. 12A, 12B, 12C and 12D are views for illustrating schematically relationships between vibrations in the vertical direction and two-dimensional arrays (maps) of correlation values.
Figure 12B:
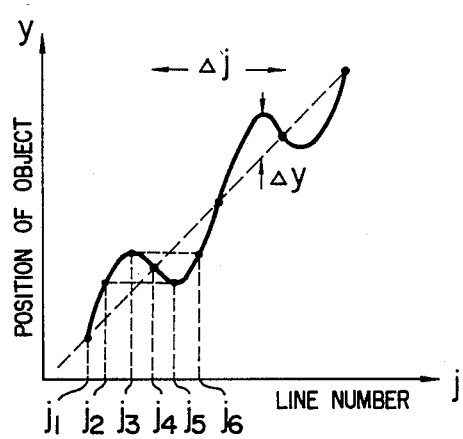
Figure 12C:
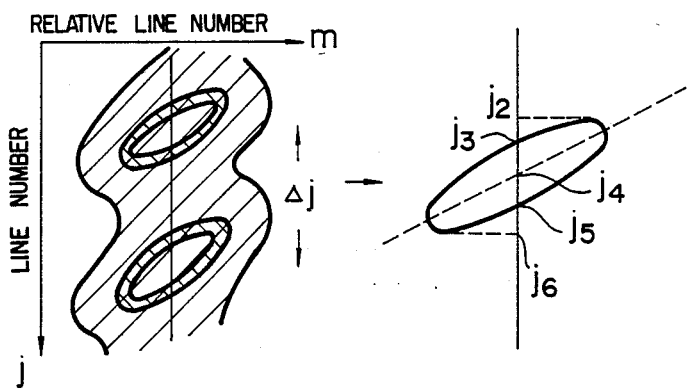
Figure 12D:
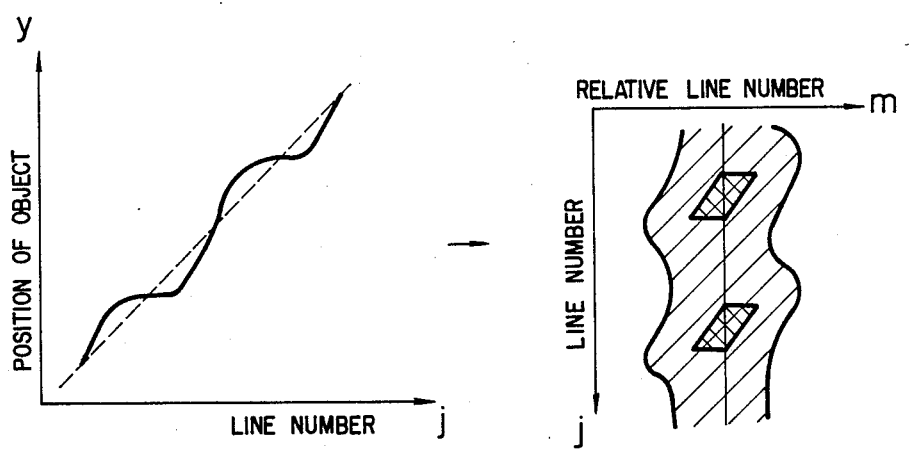

Next, description will be made on the estimation of the scan vibration in the vertical direction perpendicular to the scanning direction. The image data which has undergone the correction of vibration in the scanning direction and in which only the scan vibration appears only in the vertical direction perpendicular to the scanning direction is represented by $x'(i, j)$. An image line fragment of the j-th line having a length l and including the i-th pixel as the center pixel is assumed, and the values of mutual correlation $R_j(i, j, m)$ with image line fragments in upper and lower regions each including M lines are determined in accordance with $$R_j(i, j, m) = \frac{1}{l} \sum_{t=-l/2}^{l/2} x'(i + t, j) \cdot x'(i + t, j + m) \tag{14}$$

where m represents the relative line number. The mutual correlation values $R_j(i, j, m)$ may be considered equivalent to a two-dimensional array of the line number j and the relative line number m. The vibration in the vertical direction perpendicular to the scanning direction is estimated from the two-dimensional array of the correlation values. First, it is assumed that no vibration of scanning occurs at all. When the scanning position y on the object under examination varies linearly as a function of the line number, as is illustrated in FIG. 12A, the correlation patter becomes maximum when $m=0$ and decreases as the absolute value of m is increased, because the distance on the object or specimen under observation is increased with the correlation being reduced as the absolute value of m is increased. Next, it is assumed that the vibration of scanning is of such magnitude that the reversal of the scanning lines may occur. Further, it is assumed that the vibration is a sort of simple oscillation having a period $\Delta j$ and an amplitude $\Delta y$. The correlation pattern assumes a maximum value when $m=0$. However, the position of the line numbered $j_2$ corresponds to that of the line $j_4$ on the specimen under observation. Accordingly, correlation of a large value is seen at the point $m=j_2-j_1$. The correlation of a large value at the points other than the point $m=0$ makes appearance within a range of $j_2 \leq j \leq j_6$, wherein a pattern illustrated in FIG. 12C is obtained by interconnecting maximal values of the correlation. The slope of the major axis of the elliptical pattern is equal to $\frac{1}{2}$, and magnitude $(j_6 - j_2)$ of the pattern is increased as the amplitude y becomes larger provided that the period is constant. In contrast, in case the magnitude of vibration is relatively small so that no exchange or replacement of the scanning lines occurs, the pattern under consideration is such as illustrated in FIG. 12D, wherein the major axis of the distribution is however inclined with a slope of $\frac{1}{2}$.

The correlation value pattern shown in FIG. 12C is additively projected from the upper right to the lower left. The projection is performed with an inclination of $\frac{1}{2}$. Of the correlation value pattern, the portion which is of significance for estimation of the vibration of scanning is only that part which has a great correlation value. Accordingly, influence of the part in which the correlation is of low value should preferably be eliminated. For this reason, the projection processing of the correlation value pattern is realized in accordance with $$\left.\begin{array}{l} P_{l,i}(j) = \sum_{s=-M}^{M} R'(i, j + s/2, s) \\ R'(i, j, m) - R(i, j, m) \quad R(i, j, m) \geq \theta \\ 0 \qquad R(i, j, m) \leq 0 \end{array}\right\} \tag{15}$$

where $P_{l,i}(j)$ represents the projected data of the correlation value and $\theta$ represents a threshold value.

The correlation value projection data $P_{l,i}(j)$ which is a function of the line number j has a peak at the center $j_4$ of the elliptical map of correlation values, wherein the height of the peak depends on the length of the ellipse. The center position $j_4$ corresponds to the zero-cross point of the vibration, and the length of ellipse is a function of the amplitude $\Delta y$ of vibration. Accordingly, the data obtained through the projection mentioned above carries information about the amplitude, period and phase of the vibration. It should however be noted that the data $P_{l,i}(j)$ resulting from the projection assumes necessarily positive values and that the peak occurs at the zero-cross point of the vibration. Accordingly, the following processings mentioned below are required:

(1) Band-pass filtering processing: Only the information in the band close to the resonance frequency of the vibration is extracted for use. Fourier transformation is employed.

(2) Phase shift by $\pi/4$: Consideration should be paid to the fact that the period of vibration is not constant.

(3) Proportional calculation processing: Conversion of intensity of data resulting from the projection into the line number representative of magnitude of vibration. Through the procedure described above, the magnitude of vibration in the vertical direction can be determined.

Figure 11:
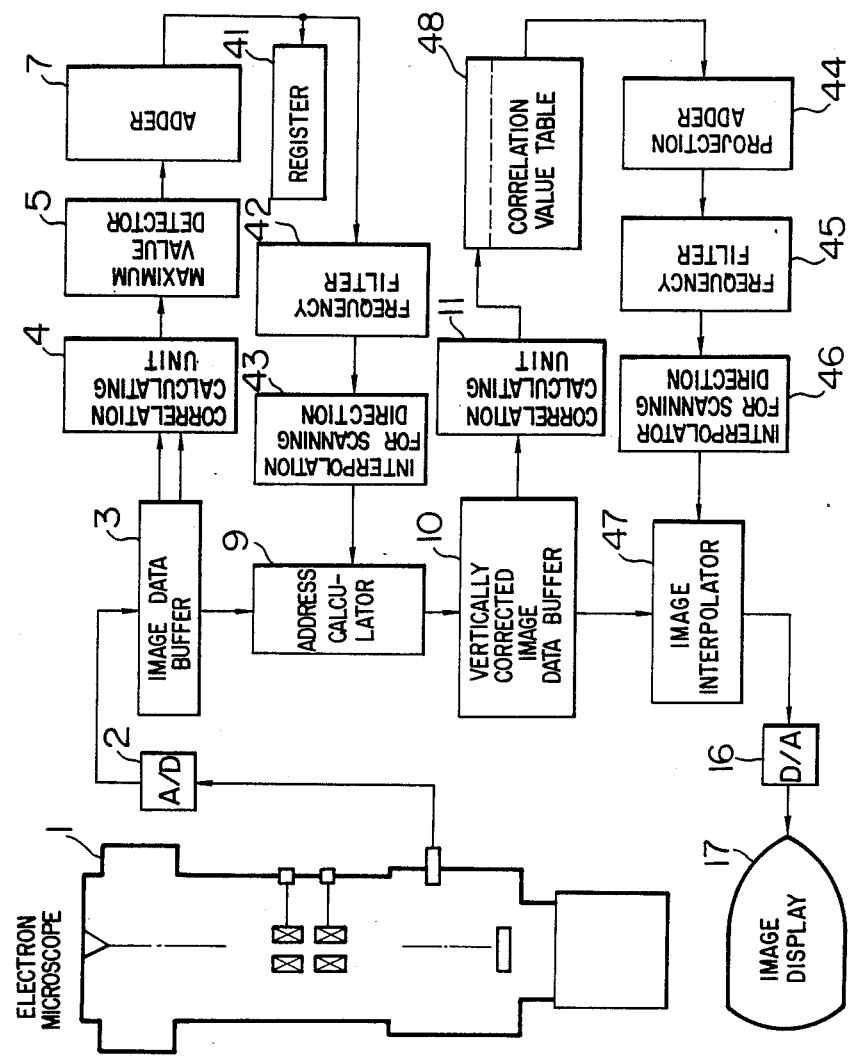
FIG. 11 is a view showing a general arrangement of an image correction system for SEM according to a third embodiment of the present invention.

In the following, a third embodiment of the present invention will be described by referring to FIGS. 11 and 13. An image signal produced through scanning operation in a SEM 1 is converted to a digital signal through an A/D converter 2 and is first stored in an image data buffer 3. Image data of the two adjacent lines in the image data buffer 3 are inputted to a correlation calculation unit 4 to determine the mutual correlation function R(i, j, k) between image line fragments in accordance with the expression (11). Since variation in the vibration of the scanning direction is relatively small, the mutual correlation function R(i, j, k) is determined only at typical points $i_s$ (where s=1, ..., N) on the scanning line. For each of the typical points $i_s$, the value at a point within a function variability domain (2P+1) is compared through a maximum value detector 5, whereby the relative positional deviation $k_j(i_s)$ giving the maximum value is outputted. The relative positional deviation data obtained through the maximum value detector 5 is outputted in a number corresponding to the number N of the image line fragments contained in a single line every time the scanning proceeds by one line. The relative positional deviation $k_j(i_s)$ is added with the absolute positional deviation $d_{j-1}(i_s)$ held by the register 41 through an adder 7, the results of the addition being sequentially integrated in accordance with the expression (12), whereby the absolute positional deviation $d_j(i_s)$ for the currently scanning line number is determined.

The absolute positional deviations $d_j(i_s)$ are then subjected to the low frequency component eliminating processing with respect to the respective image line fragment positions $i_s$ through a frequency filter 42 in accordance with the expression (13). However, in the case of the instant embodiment, the equivalent processing is realized in terms of a real space processing in accordance with the following expression:

$$\hat{d}_j(i_s) = \sum_{p=-n}^{n} a_p \cdot d_{j-p}(i_s) \quad (16)$$

A coefficient $a_p$ appearing in the expression (16) is preliminarily determined through Fourier inverse transformation of the expression (13) realizing the frequency filter. Since the estimated values $\hat{d}_j(i_s)$ of variation in the scanning direction are obtained only at the typical points $i_s$ (where s=1, ..., N) on one scanning line, the vibration at all the pixel positions i.e. the absolute positional deviation is determined by interpolating means through linear interpolation in the scanning direction in accordance with $$\hat{d}_j(i) = \frac{\hat{d}_j(i_s) - \hat{d}_j(i_{s-1})}{i_s - i_{s-1}} \cdot (i - i_{s-1}) + \hat{d}_j(i_s) \quad (17)$$

where $i_{s-1} < i < i_s$.

An address calculation unit 9 increments sequentially the pixel number i starting from "1" for the line j to be corrected in the scanning direction before being outputted. Of the pixel numbers c, those for the pixel data stored in the image data buffer 3 and not yet corrected are determined in accordance with $\{i+\hat{d}_j(i)\}$ to read out the above pixel data which are then sequentially stored in an image data buffer 10 destined for storing the image data corrected with respect to the vibration in the vertical direction. The data in the image data buffer 10 is read out into a correlation calculation unit 11, whereby the mutual correlation value $R_j(i, j, m)$ is calculated in accordance with the expression (14) for one additional scanning line to be loaded in the image data buffer 10. The result of the calculation is written in a correlation table 48. Subsequently, the projection processing is performed by means of the projecting adder 44 in accordance with the expression (15) for the correlation value $R_j(i, j, m)$ written in additionally. The output of the projecting adder 44, i.e. the projected correlation data $P_{l,i}(j)$ is subjected to the low-frequency eliminating processing and the phase shift (by $\pi/4$) processing in accordance with the following expression (18), whereby the estimated vibration $\hat{V}_j(i_s)$ in the vertical direction perpendicular to the scanning direction is obtained.

$$\left.\begin{array}{l}\hat{V}_j(i_s) = \sum_{q=-n}^{n} b_q \cdot P_{l,i}(j + q) \\ s = 1, \ldots, N\end{array}\right\} \quad (18)$$

where s=1, ..., N.

Figure 13A:
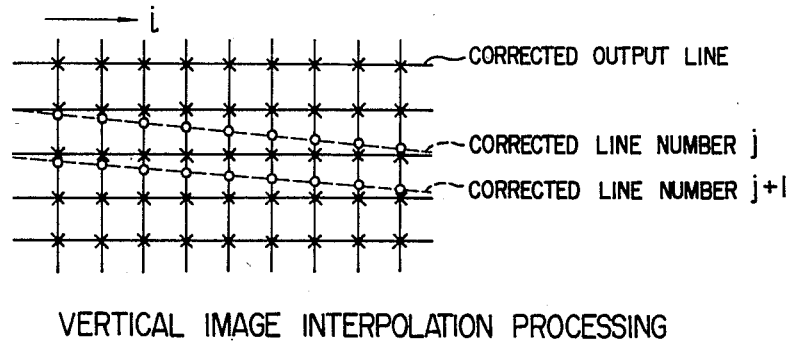
FIGS. 13A and 13B are views for illustrating schematically correction of vibration through interpolation of image in the vertical direction.
Figure 13B:
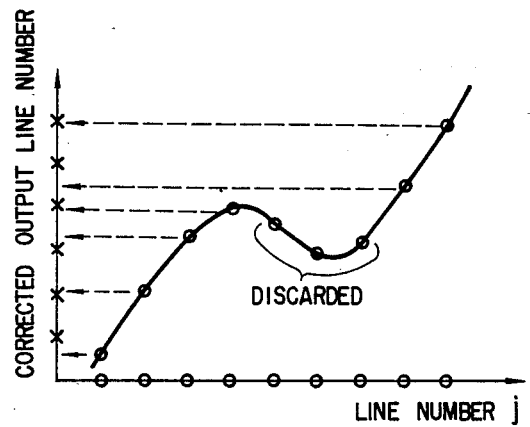

The coefficient $b_q$ is previously determined through the Fourier inverse transformation of the frequency filter as in the case of the expression (16). The estimated values $\hat{V}_j(i_s)$ of vibration in the vertical direction obtained at typical points $i_s$ (where s=1, ..., N) on one scanning line are used by the interpolating means (46) for performing interpolation in the scanning direction as in the case of the interpolation performed in accordance with the expression (17), whereby the estimated vibration values $\hat{V}_j(i)$ are determined for all the pixel positions i. The image interpolation unit 47 determines the positions of points corresponding to the individual pixel positions on the respective lines in accordance with $\{j+\hat{V}_j(i)\}$ for the scanning lines j to be outputted as the corrected lines. In FIG. 13A, the corresponding points are indicated by small circles, while the image data positions in the data buffer 10 for the image data corrected in respect to the vibration in the vertical direction are indicated by symbols x. Considering given pixel positions i, the correspondence relationship between the pixels in the vertical direction perpendicular to the scanning direction in an image in which exchange of the scanning lines has occurred is schematically illustrated in FIG. 13B for a region located in the vicinity of the area where the exchange of the scanning lines has occurred. Of the image data placed in the image data buffer 10, those pixel data derived through the duplicate scannings due to the exchange of the scanning lines are discarded. For the other pixels, the corresponding points (indicated by arrows) corrected line to be outputted are determined, and the pixel values at the corrected pixel positions (marked by x) to be outputted are determined through linear interpolation. The scan image data corrected also in the vertical direction (perpendicularly to the scanning direction) by the image interpolating unit 47 is converted to a video signal through a D/A converter 16 and displayed on an image display unit 17 as an image from which distortion due to the vibration has been eliminated. The processing described above is performed each time the scanning with the electron beam is repeated. Upon completion of the inputting of image data for one image, the processing for correction and display comes to an end.

According to the instant embodiment which is so arranged that in the image correcting system for a SEM, the estimated vibration in the scanning direction undergoes the low-frequency component eliminating processing upon estimation of the vibration of scanning on the basis of information about the correlations between the image scan line fragments while the estimated vibration in the vertical direction perpendicular to the scanning direction is effected on the basis of the one-dimensional waveform resulting from the uni-directional transformation of the two-dimensional array of the correlation values, there can be realized a system capable of correcting distortion of image due to vibration with high accuracy at a high speed without being influenced by a pattern of an oblique direction present in an object itself under observation. Although the foregoing description has been made on the assumption that the invention is applied to the processing of image produced by a scanning electron microscope, it will be appreciated that the concept of the invention can equally be applied to the processing of image produced by a scanning tunnel microscope based on an electromechanical scanning by means of a probe in which the protection against vibration-proof presents an important problem.

Now, description will be made on a fourth embodiment of the present invention by referring to FIGS. 14 to 18. According to the fourth embodiment, an image correction system for a scanning electron microscope of SEM is so arranged as to reduce blur appearing on the output image of the SEM due to mechanical vibration transmitted thereto.

Figure 14:
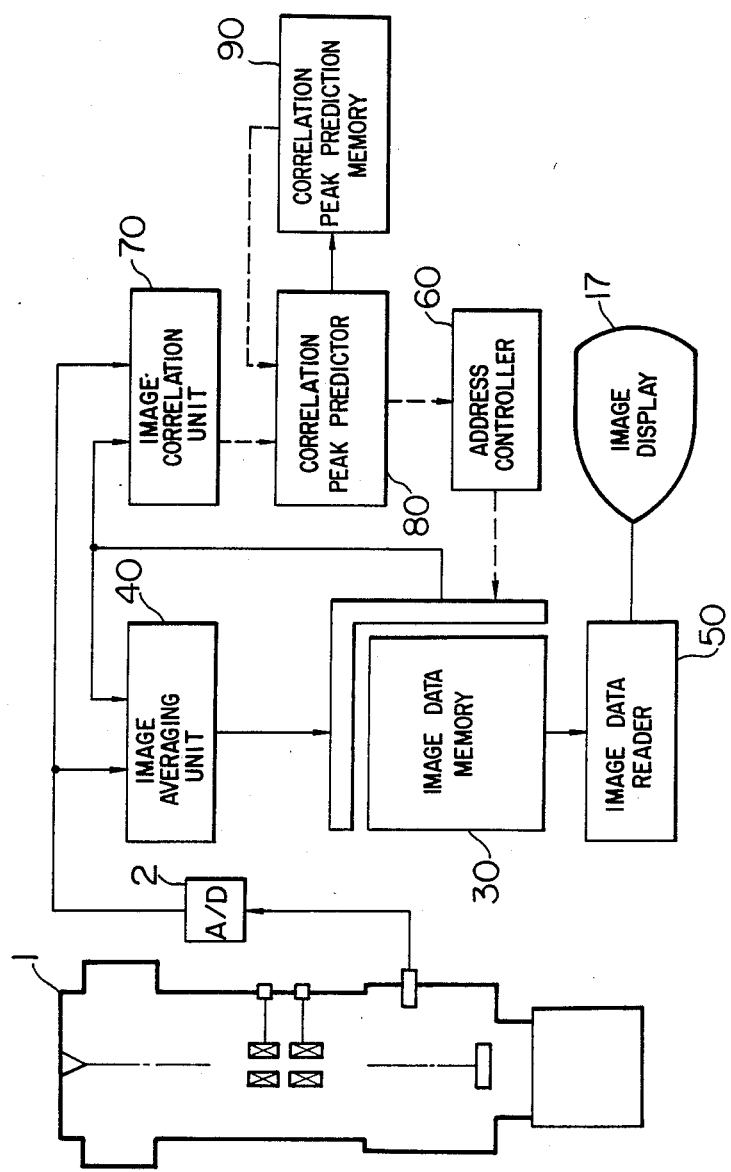
FIG. 14 is a view showing a general arrangement of an image correction system for a SEM according to a fourth embodiment of the invention.
Figure 15:
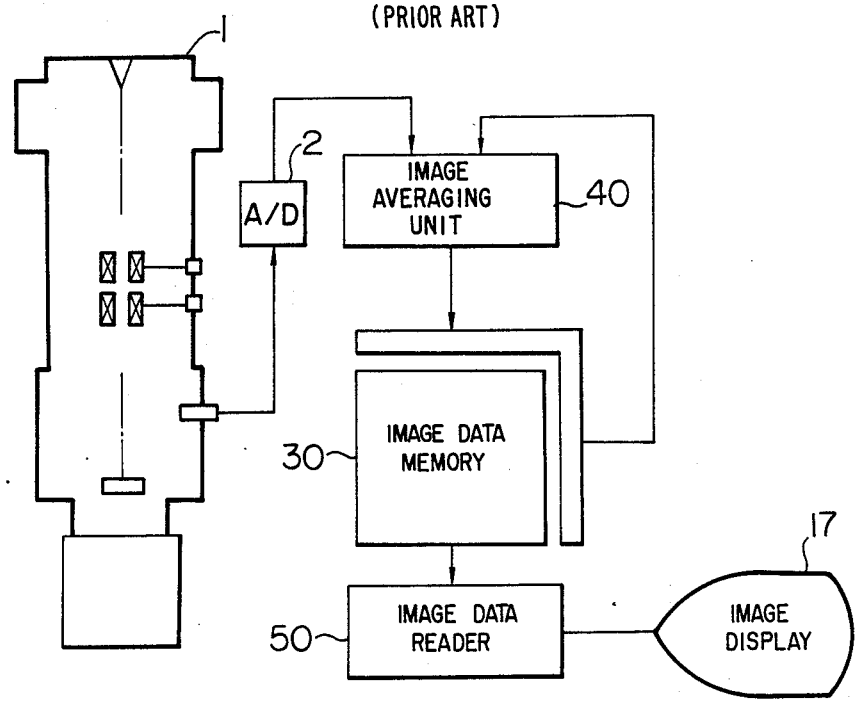
FIG. 15 is a view showing schematically a structure of a hitherto known image correction system.

Referring to FIG. 14, the image signal outputted from the SEM 1 is converted onto a digital image signal through an A/D converter 2, the digital signal being then inputted to an image averaging unit 40. A mean image data resulting from the addition and averaging of all the images produced through a preceding scanning and stored in an image data memory 30 is read out in accordance with a series of pixel position coordinates generated by an address control unit 60 in synchronism with the scanning operation of the SEM 1 to be subsequently inputted to the image averaging unit 40. Both image data of which one is supplied from the memory 30 with the other being produced by the SEM 1 are simply added together or averaged with weight through the image averaging unit 40, the resultant image data being written in the image data memory 30. The locations at which the image data are written are the same as those from which the mean image data is read out through the address control unit 60.

Figure 16:
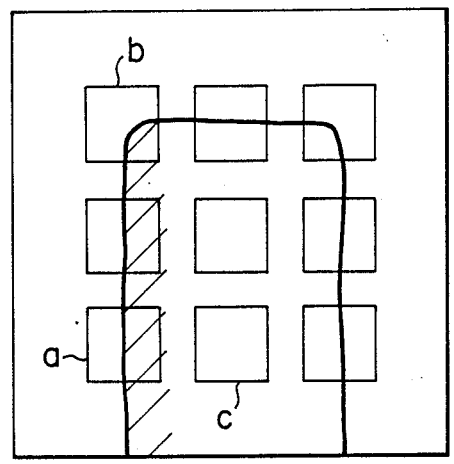
FIG. 16 is a view for illustrating a scan image and a predetermined image fragment destined for use in detecting the position where the correlation peak takes place.

On the other hand, from the scan image data outputted by the A/D converter 2, image fragment data of a size of 2n+1 (including, for example 33×33 pixels) located at a predetermined position on the image, as illustrated in FIG. 16, is cut out to be inputted to an image correlation unit 70. At the same time, an image fragment data of a sufficient size (including, for example 65×65 pixels) to cover a region of the image in which dislocation may occur due to irregular mechanical vibration is cut out from the image data read out from the image data memory 30 to be inputted to the image correlation unit 70. A two-dimensional correlation function $R_i(l, m)$ defining correlation existing between the i-th image fragment data $x_i(p, q)$ (where $-n \leq p$ and $q \leq n$) and corresponding image fragment data $y_i(p,q)$ stored in the image data memory can be given by $$R_i(l, m) = \frac{1}{(2n+1)^2} \sum_{p=-n}^{n} \sum_{q=-n}^{n} x_i(p,q) \cdot y_i(p+l, q+m) \quad (19)$$

Figure 17A:
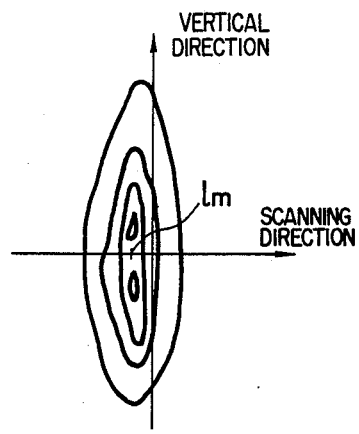
FIGS. 17A and 17B are views for illustrating schematically a two-dimensional correlation distribution of the image fragments.
Figure 17B:
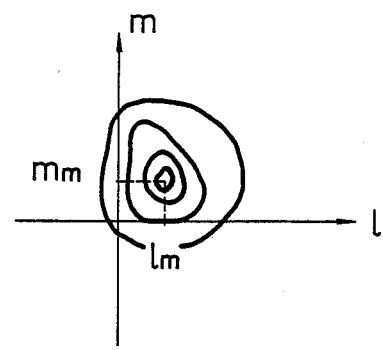
Figure 18:
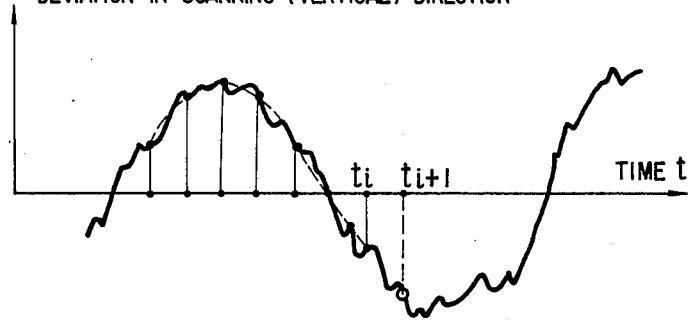
FIG. 18 is a view for illustrating a manner in which the magnitude of relative distortion of image at the position of the image fragment is predicted for the distortion corresponding to a single scanning period.

By way of example, distribution of the correlation functions are schematically illustrated in FIGS. 17A and 17B. In this connection, assuming that the pattern of the image fragment is, for example, an image pattern a of a semiconductor pattern array shown in FIG. 16, distribution of the correlation function is such as illustrated in FIG. 17A, while for an image pattern b, distribution of the correlation functions is such as shown in FIG. 17B. For each of the image fragments, the aforementioned correlation function $R_i(l, m)$ and a peak position $(l_n^i, m_m^i)$ are determined. When the correlation function presents a ridge-like pattern as in the case of the example shown in FIG. 17A, the peak position information of significance is obtained only in the direction perpendicular to that of the ridge. At the position of an image pattern c shown in FIG. 16, for example, no peak information of significance can be obtained because the image pattern is flat.

The peak position $(l_n^i, m_m^i)$ determined by the image correlation unit 70 is inputted to a correlation peak position predictor unit 80 which functions to determine the correlation peak position predictor for a succeeding input image frame produced through the scanning on the basis of the contents of a correlation peak position predicting memory 90 resulting from the preceding processing and the currently available correlation peak position with the aid of an autoregression model, the correlation peak position predictor thus obtained being stored in the memory 90 and at the same time supplied to the address control unit 60. On the other hand, the address control unit 60 determines coefficients through interpolation of the predicted correlation peak position on the image fragment defined on the image produced through the scanning operation by the SEM 1, i.e. distortions ($\Delta l$, $\Delta m$) required for superposing the images onto each other with least square error with the aid of an affine transformation model given by $$\begin{pmatrix} \Delta l \\ \Delta m \end{pmatrix} = \begin{pmatrix} a_{11} & a_{12} \\ a_{21} & a_{22} \end{pmatrix} \begin{pmatrix} l \\ m \end{pmatrix} + \begin{pmatrix} b_1 \\ b_2 \end{pmatrix} \quad (20)$$

More specifically, the address control unit 60 determines the pixel positions on the image data memory 3 corresponding to the individual pixels (l, m) of the image obtained through scanning as the output data (l+$\Delta l$, m+$\Delta m$) in accordance with the expression (20). The image data on the image data memory 30 is constantly read out through an image data reader 50 in parallel with the above mentioned processing to be displayed on the display unit 17. With the arrangement of the image correcting system according to the instant embodiment in which an image memory is provided in combination with a SEM for producing an image enjoying a high S/N ratio by adding and averaging sequentially a plurality of frame images, it is possible to determine the relative distortion between the input image produced through scanning operation and the mean image stored in the image memory through the image correlation peak searching (or detecting) processing preceding to the adding/averaging processing, whereby blur, otherwise appearing on the system output image due to fine mechanical vibration or the like, can be suppressed by correcting the above-mentioned relative distortion.

Next, a fifth embodiment of the present invention which corresponds to a version of the fourth embodiment will be described. The image correcting system according to the fifth embodiment is so arranged as to be capable of detecting positional deviation between frame images with high accuracy even in the case of an object or specimen under observation which has many flat portions and thus exhibits low S/N ratio as with the case of a semiconductor pattern.

In the first place, the concept according to the fifth embodiment will be explained.

When an object or specimen for observation which has many flat regions and low S/N ratio such as a semiconductor pattern is to be dealt with, detection may be falsified by noise. On the other hand, in order to ensure satisfactory detection accuracy regardless of the types of objects for observation, an enormous amount of arithmetic operation is required. In light of the situation mentioned above, it is contemplated that when data obtained through production of the frame image of low S/N ratio in a certain direction exhibit a pattern peculiar to that frame image, the projected data in that direction is obtained for every frame to be utilized for detecting the positional deviation between the frame images through one-dimensional correlating operation with high accuracy with the resource for the operation being reduced, to thereby eliminate vibration appearing in the image in the course of repeated observation.

As noise of the frame image, additive white noise is considered. Further, the direction in which the data obtained through projection presents a peculiar pattern is orientated to coincide with the vertical direction perpendicular to the scanning direction. On these assumed conditions, the data of the i-th scanning line represented by $g_{ij}(t)$ can be regarded as a one-dimensional signal given by $$g_{ij}(t) = f_i(t) + n_{ij}(t) \qquad (21)$$

where $f_i(t)$ represents a signal component, and $n_{ij}(t)$ represents noise component. When the number of lines as projected is represented by N, the data $P_j(t)$ obtained through projection of the j-th frame image can be expressed from the expression (21) as follows;

$$P_j(t) = \sum_{i=1}^{N} g_{ij}(t) \qquad (22)$$
$$= \sum_{i=1}^{N} f_i(t) + \sum_{i=1}^{N} n_{ij}(t)$$

The above expression expresses the projected pattern peculiar to the image. In the above expression, the first term on the right side represents the projection data of signal components common to all the frame images, and the second term represents the projection data of noise which differs from one to another frame images. However, since the dispersion of the second term decreases in proportion to $\sqrt{N}$, it is possible to reduce the influence of noise to the projection data $P_j(t)$. In this manner, the peculiar pattern obtained through the projection processing reflects materially the peculiar projection pattern of the signal itself. Thus, calculation of mutual correlation can be performed with high accuracy to avoid the erroneous or falsified detection of the positional deviation by suppressing the influence of noise without incurring loss of information carried by the signal.

Next, description will be given on how the number of arithmetic operations can be decreased according to the instant embodiment of the invention. The number $C_{2D}$ of operations in total required for the two-dimensional mutual correlation calculation for a chip of a size $M \times N$, is given by $$C_{2D} = (2MN - 1) \times m$$

where m represents the number of typical points for which calculation for determining the correlation is performed. In contrast, when data of M points are projected at an interval of N and calculation for determining the correlation is performed with the line fragment length of K, the total number $C_p$ of operations is given by $$C_p = (N-1)M + (2K-1) \times m$$

The ratio between $C_p$ and $C_{2D}$ is $$C_p/C_{2D} \simeq \frac{MN + 2Km}{2MNm}$$

By way of example, assuming that $M = N = 100$, $K = 100$ and that $m = 10$, $$C_p/C_{2D} \simeq 1/16$$

This means that the number of operations can be decreased by a factor of 1/16 as compared with the two-dimensional mutual correlation calculation.

Finally, the advantageous effects brought about by application of the invention will be described. In a SEM equipped with an image memory and imparted with the additive writing function, it is possible to detect and correct the positional deviation of the images before being added. By virtue of this feature, blur of image resulting from the additive processing due to the positional deviation can be prevented, whereby a clear image can be obtained. Further, in standard SEMs (inclusive of those incorporating the respective image memories), the shift of image as detected can be fed back to the electron beam scanning system to thereby fix the field of view. Thus, the drift of the image of specimen brought about in the course of time lapsed as well as departure of the specimen from the field of view upon so-called stereoscopic observation performed by tilting the specimen table can be positively prevented, reducing the burden imposed on the operator in connection with the adjustment of the field of view.

Figure 19:
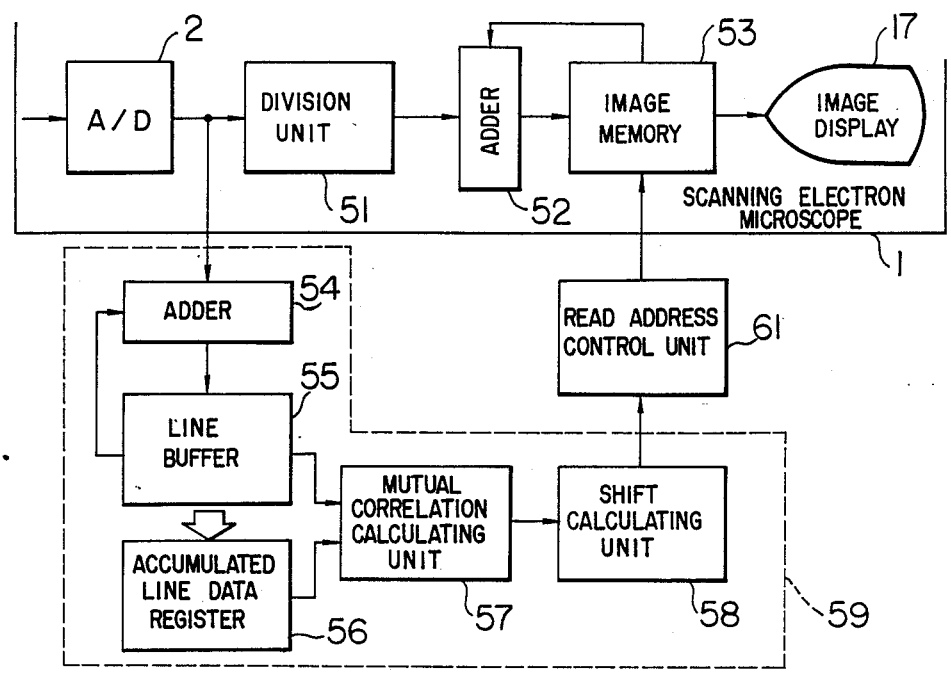
FIG. 19 is a view showing a general arrangement of an image correction system for SEM incorporating an image memory according to a fifth embodiment of the invention.

In the following, the fifth embodiment of the present invention will be described in detail by referring to FIGS. 19 and 20. Referring to FIG. 19, a scanning electron microscope equipped with an image memory 53 and imparted with the additive writing function produces image data signal in response to reception of a processing start signal. The image data signal is converted into a digital signal through an A/D converter 2 to be supplied to a division unit 51 where the digital signal is divided by 1/addend (the number of additions). The output signal of the division circuit 51 is added with the content read out from the image memory 53 at an address designated by an address controller 61, the result of addition being again written in the image memory 53 at the same address. This processing is performed continuously during one frame cycle and repeated a number of times equal to the number of additions. On the other hand, an image shift detector 59 responds to the processing start signal to perform initialization processing through which the accumulated line data of a frame image is produced by an adder 54 and a line buffer 55 in synchronism with the electron beam scanning in the SEM to determine the position of the origin referred to in the detection of image shift, whereupon the line data is stored in an accumulated line data register 56 to be utilized as the base data. In succession to the initialization mentioned above, the shift detection cycle is started. In the shift detecting cycle, the accumulated line data are generated by the adder 54 and the line buffer 55 for the second and subsequent frame images as counted from the start of processing. Upon creation of the line data, the mutual correlation between the data just created and the base data is determined by means of a mutual correlation calculation unit 57 for a number of points by varying the location of the line buffer 55 from which the data is read out. Every mutual correlation as calculated is immediately transferred to a shift calculating unit 58 for detecting the maximum value through comparison procedure. Upon completion of the calculation of the mutual correlation, the position at which the maximum value has been detected is determined with reference to the origin. The data of this position is supplied to the address control unit 61 as a quantity representative of the image shift to be used as the quantity for correction in the additive writing processing.

According to the instant embodiment of the invention, the correction of the image shift can be performed in synchronism with the electron beam scanning in the SEM on the real-time basis. Besides, the correction of image shift can be performed through the simple processing of altering the address of the image memory from which the image data is read out. Further, since all the processings can be performed in synchronism with the processing cycle in the SEM 1, the processing except for the creation of the accumulated data can be completed within an inter-frame period (within a blanking period of about 1 msec in terms of TV rate). Because the additive writing processing of the scan image produced by the SEM can be executed in parallel with the shift detecting processing performed by the image shift detecting unit 59, the result of shift detection in a given frame cycle can not be reflected by that given frame. For this reason, the result of shift detection obtained in the immediately preceding cycle is used in the image correction system according to the instant embodiment.

Figure 20:
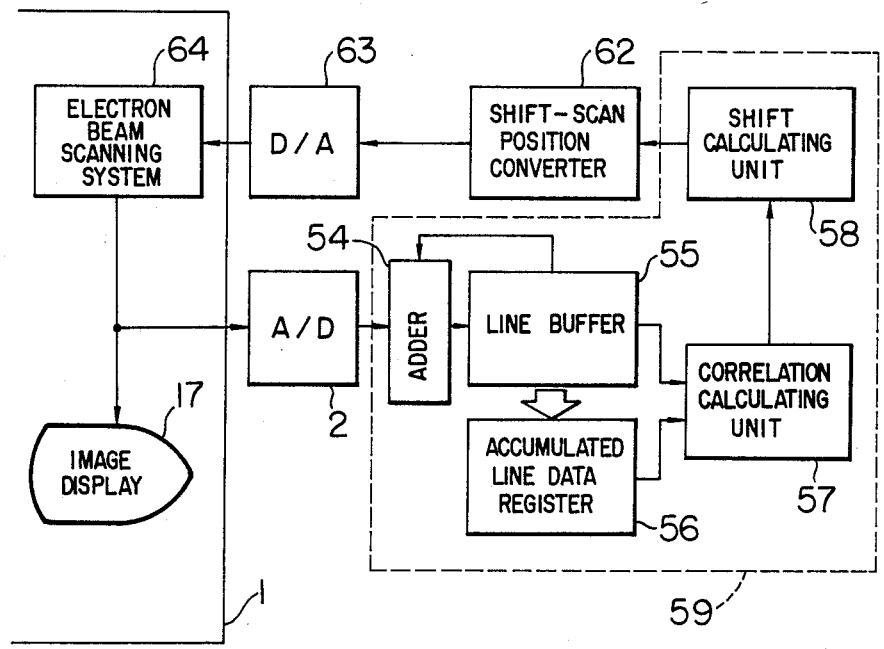
FIG. 20 is a view showing a modification of the fifth embodiment and shows a general arrangement of an image correction system for SEM incorporating no image memory.

FIG. 20 shows another embodiment of the present invention which is adapted to be used for a SEM equipped with no image memory and in which the image shift is corrected by directly varying the scan control signal of an electron beam scanning system 64 instead of varying the read address. Since all the signals used internally of the SEM 1 are of analogue nature, the signal outputted from the SEM 1 is first converted into a digital signal through an A/D converter 2 to be subsequently supplied to an image shift detecting unit 59. The data representative of the shift determined by the unit 59 undergoes data translation to be converted into a scan position signal through a shift-scan position converter 62. The output signal of the converter 62 is then converted to an analogue signal through a D/A converter 63 to be subsequently applied to the electron beam scanning system 64 for changing the scanning position. According to this embodiment, not only the vibration of image can be prevented but also the specimen under observation can be protected against disappearance from the field of view.

In each of the frame cycles mentioned above, it is possible to detect the positional deviation relative to the immediately preceding frame image by transferring the contents of the line buffer to the accumulated line data register upon completion of the image shift detection processing. This method is effective in the case where features of the image vary as a function of time lapse, although it is accompanied with the possibility of error being accumulated Further, by providing an image memory as an image buffer between the A/D converter 2 and the adder 54 for the purpose of allowing the input image data to be first stored in the image buffer and changing the reading address of the image buffer in accordance with the magnitude of shift arithmetically determined by the image shift calculation unit in the same cycle, it is possible to realize the correction of the image shift without time delay in the detection of the positional deviation, whereby degradation of accuracy otherwise involved by the time delay can be prevented.

Figure 22A:
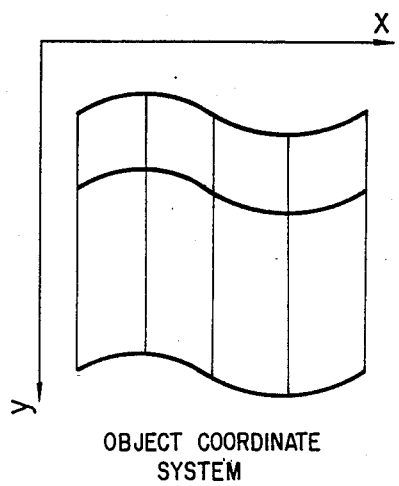
FIGS. 22A and 22B are views showing an objective coordinate system to be imaged and an output image coordinate system together with distortion for illustrating the operation principle of the sixth embodiment shown in FIG. 21.
Figure 22B:
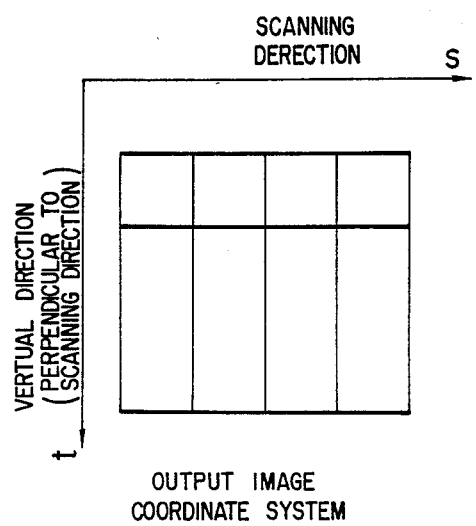

FIGS. 22A and 22B are views for illustrating the principle of estimating image distortion. More specifically, FIG. 22A shows a coordinate system for the image produced through scanning with an electron beam in a scanning electron microscope or SEM. FIG. 22B shows a coordinate system set for an object (specimen) under examination. When the electron beam scans the object correctly without being influenced by external disturbance, the output image coordinates (s, t) coincide with the object coordinates (x, y). However, assuming now that stray magnetic field of 50 Hz generated by a power supply source brings about undesired deflection of the electron beam, that the scanning period is 40 msec as is encountered in the slow scan mode of the standard SEM or an integral multiple thereof and that synchronism with the phase of the power supply source at the time of starting the scanning with the electron beam is established (i.e. phase-lock is established such that the electron beam scanning starts at the phase of $\theta$), the output image suffers distortion for the reasons described below. In this connection, an example of distortion is illustrated in FIGS. 22A and 22B.

A point (x, y) on the object coordinate system which corresponds to a point (s, t) on the output image coordinate system is given by $$x = s + \alpha \sin(\omega s + \theta) \quad (23)$$

$$y = t + \beta \sin(\omega s + \theta) \quad (24)$$

where $\alpha$ and $\beta$ represent amplitudes of deviations of the electron beam (i.e. vibrations due to stray magnetic field) in the scanning direction and in the vertical direction perpendicular thereto, respectively, and $\omega$ represents the period of vibration. In the expressions (23) and (24), the period and phase of the vibration are known, while the amplitudes $\alpha$ and $\beta$ are the parameters of vibration to be estimated.

The image intensity f(x, y) at the object coordinates (x, y) undergoes geometrical distortion due to the coordinate translations in accordance with the expressions (23) and (24). Accordingly, the output image intensity at the output image coordinates (s, t) can be given by the following expressions with the synchronous phase $\theta$ serving as a parameter.

$$g(s, t, \theta) = f\{s + \alpha \sin(\omega s + \theta), t + \beta \sin(\omega s + \theta)\} \quad (25)$$

Through partial differentiation of the expression (25) with respect to the synchronous phase $\theta$, $$\frac{\partial g}{\partial \theta} = \frac{\partial f}{\partial x} \cdot \alpha \sin(\omega s + \theta) + \frac{\partial f}{\partial y} \cdot \beta \sin(\omega s + \theta) \quad (26)$$

while partial differentiation of the output image coordinates (s, t) are given by $$\frac{\partial g}{\partial s} = \frac{\partial f}{\partial x} \{1 + \alpha \omega \sin(\omega s + \theta)\} + \frac{\partial f}{\partial y} \cdot \beta \omega \sin(\omega s + \theta) \quad (27)$$

$$\frac{\partial g}{\partial t} = \frac{\partial f}{\partial y} \quad (28)$$

From the expressions (26) and (27)

$$\frac{\partial g}{\partial s} - \frac{\partial g}{\partial \theta} \cdot \omega = \frac{\partial f}{\partial x} \quad (29)$$

From the expressions (26), (28) and (29), $$\left(\frac{\partial g}{\partial s} - \frac{\partial g}{\partial \theta} \cdot \omega\right) \cos(\omega s + \theta) \cdot \alpha + \frac{\partial g}{\partial t} \cos(\omega s + \theta) \cdot \beta = \frac{\partial g}{\partial \theta} \quad (30)$$

Thus, a linear expression having unknown quantities $\alpha$ and $\beta$ as variables is obtained. Since the expression (30) is effected at all the points on the output image coordinate (s, t) system, observation equations for estimating $\alpha$ and $\beta$ can be obtained in a number corresponding to the number of the pixels. Estimation of the vibration amplitudes $\alpha$ and $\beta$ can be made by a method of least squares with minimum error.

In the practical image processing, differentiation can be approximated by calculus of difference. For the roughest approximation, the following expressions may be employed:

$$\frac{\partial g}{\partial s} \simeq g(s + 1, t, \theta) - g(s, t, \theta) \quad (31)$$

$$\frac{\partial g}{\partial t} \simeq g(s, t + 1, \theta) - g(s, t, \theta) \quad (32)$$

$$\frac{\partial g}{\partial \theta} \simeq \{g(s, t, \theta + \Delta\theta) - g(s, t, \theta)\}/\Delta\theta \quad (33)$$

The expression (33) represents the operation for determining the difference between two images obtained by changing the synchronous phase by a minute angle $\Delta\theta$.

For determination of the estimated values of $\alpha$ and $\beta$, the expression (30) is rewritten as follows:

$$a_i \alpha + b_i \beta = c_i \quad (34)$$

Thus, the estimated values $\alpha$ and $\beta$ can be determined in accordance with $$\begin{bmatrix} \tilde{\alpha} \\ \tilde{\beta} \end{bmatrix} = \begin{bmatrix} \sum_{i=1}^{N} a_i^2 & \sum_{i=1}^{N} a_i b_i \\ \sum_{i=1}^{N} a_i b_i & \sum_{i=1}^{N} b_i^2 \end{bmatrix}^{-1} \begin{bmatrix} \sum_{i=1}^{N} a_i c_i \\ \sum_{i=1}^{N} b_i c_i \end{bmatrix} \quad (35)$$

where i represents serial numbers of the pixels, and N represents the total number of pixels used in the estimation.

The principle of vibration estimation described above can apply valid to a different scan imaging mode, e.g. a high-speed scan mode for displaying the scanned image on a monitor display. In the high-speed scan mode, imaging of one frame is usually carried out in synchronism with the frequency of the power supply source. Additionally, scanning of one frame is phase-locked at the start of the scanning. Accordingly, the expressions (23) and (24) representing the distortion as well as the expression (30) for estimating the amplitudes $\alpha$ and $\beta$ of vibrations are written as follows:

$$x = s + \alpha \sin(vt + \theta) \quad (36)$$

$$y = t + \beta \sin(vt + \theta) \quad (37)$$

$$\frac{\partial y}{\partial s} \cos(vt + \theta) \cdot \alpha + \left(\frac{\partial g}{\partial t} - \frac{\partial g}{\partial \theta} v\right) \cos(vt + \theta) \cdot \beta = \frac{\partial g}{\partial \theta} \quad (38)$$

where v represents the frequency of vibration in the vertical direction perpendicular to the scanning direction. It will be seen that the basic distortion estimating procedure remains unchanged.

In the case where the synchronization of the start of electron beam scanning with the power source frequency is established in a fixed phase, the output image data obtained by displacing the field of view by a small amount is shifted in the opposite direction by the same amount, whereby the output image having the synchronous phase deviated correspondingly can be obtained. More specifically, describing in conjunction with the expression (25), by way of example, the output image $g(s, t, \theta)$ obtained by moving the field of view by $\Delta d$ in the scanning direction is given by $$g'(s, t, \theta) = f\{s + \alpha \sin(\omega s + \theta) + \Delta d, t + \beta \sin(\omega s + \theta)\} \quad (39)$$

while the shifted output image is given by $$\begin{aligned} g''(s, t, \theta) &= g'(s - \Delta d, t, \theta) \\ &= f\{s + \alpha \sin(\omega s + \theta - \omega \Delta d), t + \beta \sin(\omega s + \theta)\} \\ &= g(s, t, \theta - \omega \Delta d) \end{aligned} \quad (40)$$

In the high-speed scan mode, the field of view and the output image coordinate system may be shifted in the vertical direction perpendicular to the scanning direction.

The above explanation of the principle has been made on the assumption that the vibration appearing in the image due to the magnetic field of the power supply source remains steady for a given time (e.g. 2 to 3 minutes). However, when the steady state cannot be maintained positively, the electron beam scanning may be repeated twice by changing over the synchronous phase so that the steadiness can be approximately assured within the range in which the method of least squares is carried out in accordance with the expression (35).

Figure 21:
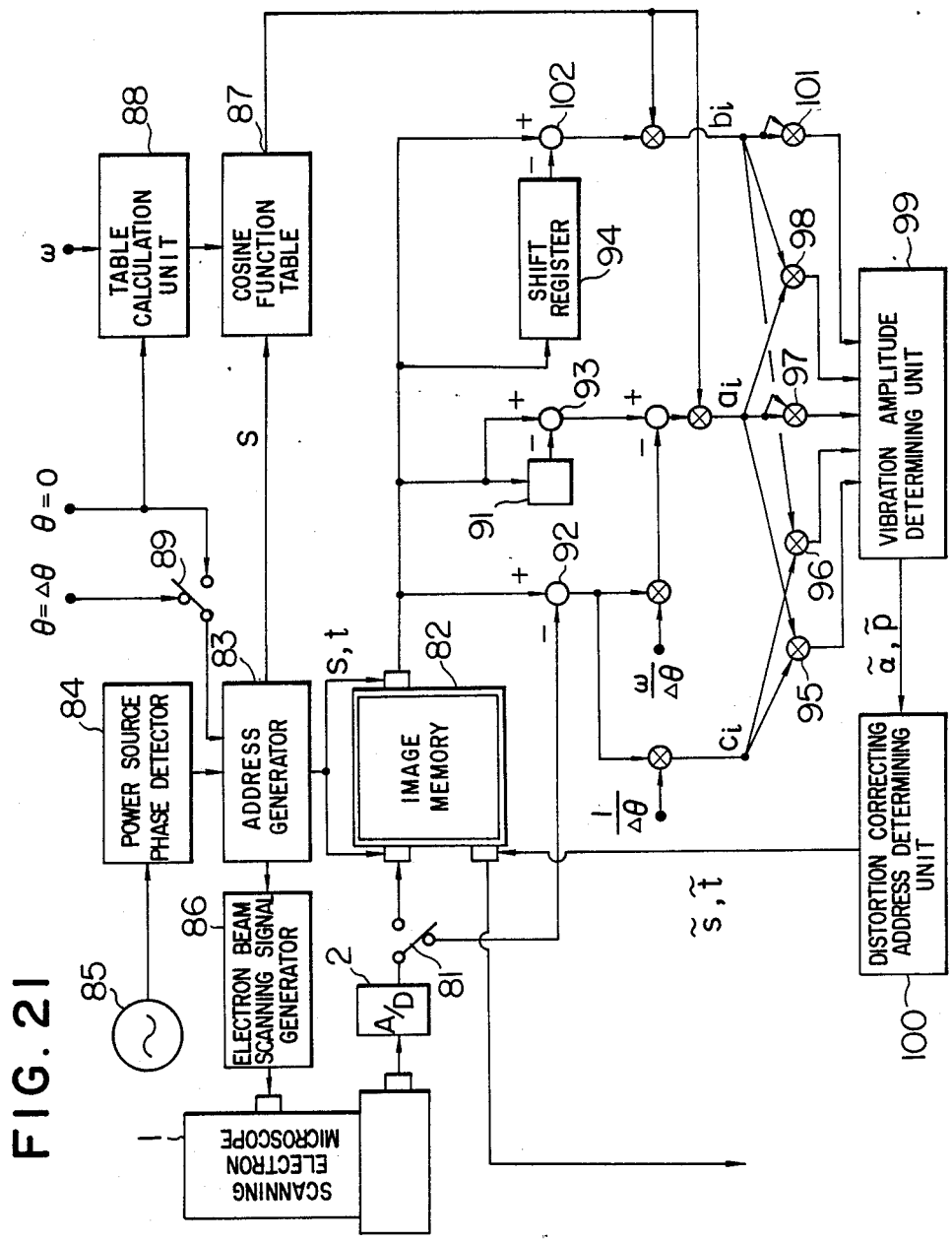
FIG. 21 is a view showing a general arrangement of an image correction system according to a sixth embodiment of the present invention.

Now, the sixth embodiment of the present invention will be described in detail by referring to FIG. 21. A signal from an AC power supply source 85 is detected in respect to the phase thereof by a phase detector 84. At the time point where the phase is zero, a synchronizing signal is supplied to an address generator 83. When the address generator 83 is in the stand-by state ready for starting of the scanning, a scanning start phase $\theta$ is inputted to the address generator which is then in the state waiting for the synchronizing signal from the phase detector 84. In response to the synchronizing signal, the address generator 83 starts to count clock pulses generated internally. When the counted value attains the phase value $\theta$ for starting the scanning operation, generation of a series of addresses for the image memory is activated. After generation of addresses for one line, the address generator is again placed in the stand-by state. For the scan start phase $\theta$, a signal representative of $\theta = 0$ is first produced by a switch 89. The address generator 83 sends a scan start synchronizing signal to an electron beam scan signal generator 86 simultaneously with the generation of the address series. In response to the scan start synchronizing signal, the electron beam scan signal generator 86 produces a linear scanning signal through an integration circuit. A scanning electron microscope or SEM 1 produces an image signal representative of image data obtained through scanning operation under the control of the scanning signal. The image data signal is then converted to a digital image data signal through an A/D converter 2 and supplied through a switch 8 to an image memory 82 to be stored therein at the address designated by the address generator 83. After the scan image data for one image has been stored in the image memory 82, the switches 89 and 81 are changed over to the positions shown in FIG. 21, whereby the image data can be again inputted. More specifically, the scan start phase $\theta$ is now set to $\Delta\theta$, whereby an image whose distortion due to magnetic field of the power supply source is deviated by a small amount of phase $\Delta\theta$ relative to that of the image stored in the image memory 9 is produced. The image data thus produced is supplied to an adder 92 through the switch 81, and the difference relative to the image data read out from the image memory 82 is determined. The image difference data is multiplied with $1/\Delta\theta$, whereby the value of the expression (34) and thus the value of $C_i$ of the expression (35) are determined. The operation mentioned above and the outputting of $C_i$ are performed in response to every clock pulse generated by the address generator 83. In synchronism with the clock, the image data stored in the image memory 82 is inputted to adders 93 and 102, whereby the values of the expressions (31) and (32) are determined. For differentiation in the scanning direction in accordance with the expression (30), a register 91 of a capacity corresponding to one pixel is employed. On the other hand, for differentiation in the vertical direction perpendicular to the scanning direction in accordance with the expression (32), a shift register 94 of a capacity corresponding to one scanning line is used. Coefficients of the vibration amplitudes $\alpha$ and $\beta$, i.e. $a_i$ and $b_i$ appearing in the expression (34) are determined in the manner shown in FIG. 21. More specifically, the coefficient $a_i$ is determined by multiplying the output of the adder 92 with a constant $\omega/\Delta\theta$, by subtracting the product from the output of the adder 93 and by multiplying the difference with a value of cos ($\omega s$) obtained by consulting a cosine function table 87 with the aid of the output image coordinates s in the scanning direction as produced by the address generator 83. The cosine table 87 contains the values obtained previously through calculation of the cosine function cos ($\omega s$) for $s = 1, 2, \ldots, 512$. The coefficient $b_i$ is obtained by multiplying the output of the adder 102 with a reference value contained in the cosine function table 87. With five multipliers 95 to 101, there can be obtained products $a_ic_i$, $b_ic_i$, $a_i^2$, $a_ib_i$, $b_i^2$ of the coefficients $a_i$, $b_i$ and $c_i$ outputted in response to every clock generated by the address generator 3. The vibration amplitude estimation operation unit 99 determines the estimated amplitude values $\widetilde{\alpha}$ and $\widetilde{\beta}$ through cumulative addition, inverse matrix operation and a matrix product operation in accordance with the expression (35). The estimated amplitude values $\widetilde{\alpha}$ and $\widetilde{\beta}$ are inputted to the distortion correcting address calculation means 100 for determining the output image coordinates $(\widetilde{s}, \widetilde{t})$ corresponding to the scan line pixel coordinate series (1,1), (2, 1), ..., (512, 1), (1, 2) ..., (511, 512) and (512, 512) of the object image coordinate system (x, y) through calculation based on the inverse functions given by the expressions (23) and (24), respectively. Subsequently, access is made to the image memory 82 to output the corrected image free of distortion.

According to the sixth embodiment, geometrical distortion of an image varying slowly under the influence of stray magnetic field generated by a power supply source can be estimated through relatively simple image processing of two images obtained by displacing the distortion only by a small amount primarily with the aid of calculus of differences. Thus, there can be obtained an SEM image substantially free of geometrical distortion due to the stray magnetic field generated by a switch board, cable or the like with error involved in the measurement of line width of a semiconductor device being significantly reduced.

As will now be appreciated from the foregoing description, according to the technique of the present invention, disturbance appearing in an output image of a SEM due to vibration superposed on the scanning can be corrected by detecting the inter-line relative deviation from the calculated peak positions of mutual correlation functions defined between the scan image line fragments in the scanning direction, while detecting the exchange of line positions by resorting to a relaxation calculus of correlations existing between the scan image line fragments over a plurality of lines in the vertical direction perpendicular to the scanning direction. Thus, the means heretofore required for measuring mechanical vibrations, fluctuation of the magnetic field and the like which are main causes for the disturbance of the electron beam scanning for allowing the magnitude of disturbance to be estimated on the basis of a scan disturbance mode is rendered unnecessary.

We claim:

1. An image correcting apparatus for a scanning electron microscope comprising: an A/D converter for converting a scanned image signal obtained from said microscope to digital image data; an image data buffer, coupled to said A/D converter, for storing said digital image data; and image processing means, coupled to said image data buffer, for correcting distortion appearing in said digital image data as a result of electromagnetic and mechanical vibrations being applied to said scanning electron microscope, wherein said image processing means includes correlation calculating means for determining relative positional deviation from a mutual correlation function between image line fragments of the image data placed in said image data buffer at relative positions in the vertical direction, perpendicular to the scanning direction, a correlation value buffer for storing the relative positional deviation, optimal sequence exchange calculating means, having an output, for determining exchange of adjacent image lines based on the relative positional deviation stored in said correlation value buffer so that the correlation value between adjacent lines becomes maximum, and means for correcting the digital image data in the vertical direction perpendicular to said scanning direction in response to the output of said optimal sequence exchange calculating means.

2. An image correcting apparatus for a scanning electron microscope comprising: an A/D converter for converting a scanned image signal obtained from said microscope to digital image data; an image data buffer, coupled to said A/D converter, for storing said digital image data; and image processing means, coupled to said image data buffer, for correcting distortion appearing in the digital image data as a result of electromagnetic and mechanical vibrations being applied to said scanning electron microscope, wherein said image processing means includes correlation calculating means, coupled to said image data buffer, for determining relative positional deviation from a mutual correlation function between image line fragments of the digital image data placed in said image data buffer at relative positions in the scanning direction, absolute positional deviation calculating means, coupled to said correlation calculating means, for determining absolute positional deviation from said relative positional deviation, and means, coupled to said absolute positional deviation calculating means, for correcting the distortion of the digital image data in the scanning direction, wherein said correcting means includes means for estimating continuously vibration of a part of respective scanning lines based on information corresponding to distortion in another part of the respective scanning lines and, as a result thereof, correcting the distortion of the corresponding digital image data.

3. An image correcting apparatus for a scanning electron microscope comprising: an A/D converter for converting a scanned image signal obtained from said microscope to digital image data; an image data buffer, coupled to said A/D converter, for storing said digital image data; and image processing means, coupled to said image data buffer, for correcting distortion appearing in the digital image data as a result of electromagnetic and mechanical vibrations being applied to said scanning electron microscope, wherein said image processing means includes correlation calculating means, coupled to said image data buffer, for determining relative positional deviation from a mutual correlation function between image line fragments of the digital image data placed in said image data buffer at relative positions in the scanning direction, absolute positional deviation calculating means, coupled to said correlation calculating means, for determining absolute positional deviation from said relative positional deviation, where said absolute positional deviation calculating means includes a frequency filter for eliminating low-frequency components of said absolute positional deviation, and means, coupled to said absolute positional deviation calculating means, for correcting the distortion of the digital image data in the scanning direction in response to said absolute positional deviation.

4. An image correcting apparatus for a scanning electron microscope comprising: an A/D converter for converting a scanned image signal obtained from said microscope to digital image data; an image data buffer, coupled to said A/D converter, for storing said digital image data; and image processing means, coupled to said image data buffer, for correcting distortion appearing in said digital image data as a result of electromagnetic and mechanical vibrations being applied to said scanning electron microscope, wherein said image processing means includes correlation calculation means for determining relative positional deviation from a mutual correlation function between image line fragments of the image data placed in said image data buffer at relative positions in the vertical direction perpendicular to the scanning direction, a correlation value table for storing the relative positional deviation, first arithmetic means for determining projection data based on the relative positional deviation obtained from said correlation value table, second arithmetic means for determining vibration of the scanning in the vertical direction perpendicular to the scanning direction from said projection data, and means for correcting the digital image data in the vertical direction perpendicular to said scanning direction in response to information indicative of the vibration determined by said second arithmetic means.

5. An image correcting apparatus for a scanning electron microscope, comprising: an A/D converter for converting a scanned image signal obtained from said microscope to digital image data; an image data buffer for storing digital image data; and image processing means for correcting distortion appearing in the digital image data as a result of electromagnetic and mechanical vibrations being applied to said scanning electron microscope, wherein said image processing means includes power source phase detecting means for detecting the phase of a power supply source of said scanning electron microscope, electron beam scanning control means for starting the electron beam scanning when a phase detected by said detecting means is equal to a preset phase, image data memory means for storing scanned image data obtained by activating said electron beam scanning control means at a preset phase, distortion-displaced image input means for inputting other scanned image data by varying said preset phase by a minute amount, subtracting means for determining the difference between the scanned image data on said image data memory and other scanned image data inputted through said distortion-displaced image input means, differential arithmetic means for determining differentials of said image data in both the scanning direction and the vertical direction perpendicular to said scanning direction, estimating means for estimating distortion, resulting from the magnetic field from said power supply source, in response to the difference derived by said subtracting means and the differentials derived by said differential arithmetic means using a method of least squares based on difference equations, and image distortion correcting means for correcting the image data stored in said image data memory means based on said estimated distortion.

6. An image correcting apparatus for a scanning electron microscope, comprising: an A/D converter for converting a scanned image signal obtained from said microscope to digital image data; an image data memory for storing the digital image data; image averaging means, coupled between said A/D converter and said memory, for additively averaging the image data received from said A/D converter and the image data stored in said image data memory and for writing the result of the additive averaging in said image data memory; image data projection means, coupled to said A/D converter and said image data memory, for summing up the image data from said A/D converter and the image data stored in said image data memory in one direction; line data buffers, coupled to said image data projection means, for storing the projected image data from said A/D converter and said image data memory; line data correlating means, coupled to said line data buffers, for determining relative positional deviation between image data from said A/D converter and the image data stored in said image memory perpendicular to the projection direction; distortion calculating means, coupled to said image correlating means, for determining magnitude of distortion of said image data received from said A/D converter and the image data stored in said image data memory from the relative positional deviation determined by said image correlating means; and image transforming means, coupled between said distortion calculating means and said image data memory, for correcting the image data stored in the memory based on the magnitude of the distortion.

7. An image correcting apparatus for a scanning electron microscope according to claim 5, wherein said distortion-displaced image inputting means includes: means for inputting the scan image obtained by moving a field of view associated therewith by a minute amount with the preset phase of said electron beam scanning control means being locked; and means for shifting an input image coordinate system employed by said minute amount.

* * * * *